(12) United States Patent
Ko et al.

(10) Patent No.: US 12,411,582 B2
(45) Date of Patent: Sep. 9, 2025

(54) DISPLAY DEVICE INCLUDING TOUCH SENSOR

(71) Applicant: SAMSUNG DISPLAY CO., LTD., Yongin-si (KR)

(72) Inventors: Gyung Min Ko, Yongin-si (KR); Seong Jun Lee, Yongin-si (KR); Yong Hwan Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/399,247

(22) Filed: Dec. 28, 2023

(65) Prior Publication Data

US 2025/0028415 A1    Jan. 23, 2025

(30) Foreign Application Priority Data

Jul. 20, 2023    (KR) .................. 10-2023-0094807

(51) Int. Cl.
    *G06F 3/044*      (2006.01)
    *G06F 3/041*      (2006.01)
    *H10K 59/35*      (2023.01)
    *H10K 59/40*      (2023.01)

(52) U.S. Cl.
    CPC ......... *G06F 3/0446* (2019.05); *H10K 59/353* (2023.02); *H10K 59/40* (2023.02); *G06F 3/0412* (2013.01); *G06F 2203/04112* (2013.01)

(58) Field of Classification Search
    None
    See application file for complete search history.

(56) References Cited

U.S. PATENT DOCUMENTS

| 10,126,864 | B2 | 11/2018 | Jeong et al. | |
|---|---|---|---|---|
| 2014/0285729 | A1* | 9/2014 | Lou | G06F 3/0412 349/12 |
| 2017/0102804 | A1* | 4/2017 | Kikukawa | G06F 3/047 |
| 2017/0336907 | A1* | 11/2017 | Jeong | G06F 3/0446 |
| 2021/0200365 | A1* | 7/2021 | Lee | H10K 50/865 |
| 2022/0029138 | A1* | 1/2022 | Wang | H10K 50/865 |

FOREIGN PATENT DOCUMENTS

| JP | 2022-010750 | 1/2022 |
|---|---|---|
| KR | 10-1929281 | 3/2019 |
| KR | 10-2432128 | 8/2022 |

\* cited by examiner

*Primary Examiner* — Dorothy Harris
(74) *Attorney, Agent, or Firm* — F. CHAU & ASSOCIATES, LLC

(57) ABSTRACT

A display device includes a display part formed on a base layer, the display part including a plurality of pixels, and a sensor part disposed on the display part, the sensor part including a conductive pattern layer and a cover layer disposed on the conductive pattern layer. The conductive pattern layer forms a first sensing electrode and a second sensing electrode, and includes an edge portion forming a disconnection area. The cover layer includes a first cover layer overlapping the disconnection area in a plan view.

19 Claims, 21 Drawing Sheets

DISPLAY DEVICE INCLUDING TOUCH SENSOR

CROSS-REFERENCE TO RELATED APPLICATION

This application claims priority under 35 U.S.C. § 119 to Korean Patent Application No. 10-2023-0094807, filed on Jul. 20, 2023, the disclosure of which is incorporated by reference herein in its entirety.

TECHNICAL FIELD

Embodiments of the disclosure generally relate to a display device including a touch sensor.

DISCUSSION OF RELATED ART

As advancements are made in the area of information technology, the use of a display device as a connection medium between a user and information has increased. The display device may include a light source such as an inorganic light emitting element or an organic light emitting element.

The display device may include a display panel that displays an image and a sensing panel that senses an object. The sensing panel may be used to determine a position of a touch input provided by a user.

SUMMARY

Embodiments of the disclosure provide a display device including a touch sensor, which can improve visibility.

Embodiments of the disclosure provide a display device including a touch sensor, in which a cross-sectional structure of a panel is simplified, which as a result, can improve processing properties.

In accordance with an aspect of the disclosure, a display device includes a display part formed on a base layer, the display part including a plurality of pixels, and a sensor part disposed on the display part, the sensor part including a conductive pattern layer and a cover layer disposed on the conductive pattern layer. The conductive pattern layer forms a first sensing electrode and a second sensing electrode, and includes an edge portion forming a disconnection area. The cover layer includes a first cover layer overlapping the disconnection area in a plan view.

In an embodiment, the conductive pattern layer includes a first conductive pattern layer and a second conductive pattern layer, which are disposed in different layers. The first sensing electrode includes a plurality of first cells and a first bridge electrically connecting the first cells to each other, and the second sensing electrode includes a plurality of second cells and a second bridge electrically connecting the second cells to each other. The edge portion includes a first edge portion and a second edge portion, which are formed by the second conductive pattern layer, and the disconnection area is formed between the first edge portion and the second edge portion. The disconnection area is formed in the first cells and the second cells. The first cells and the second cells are formed by the second conductive pattern layer, and have a mesh structure.

In an embodiment, the first cells and the second cells are adjacent to each other with a separation line interposed therebetween, and at least a portion of the second conductive pattern layer is disconnected and forms a separation disconnection area which defines the separation line. The first cover layer covers the separation disconnection area.

In an embodiment, the cover layer further includes a second cover layer covering at least a portion of the second conductive pattern layer, and the second cover layer does not overlap the disconnection area and the separation disconnection area in the plan view.

In an embodiment, each of the first cover layer and the second cover layer is provided in a plurality and is arranged in a matrix structure.

In an embodiment, the cover layer includes at least one of a black pigment and a black dye.

In an embodiment, the cover layer has a polygonal shape or a circular shape in the plan view, and is in contact with a portion of the second conductive pattern layer.

In an embodiment, the conductive pattern layer includes a first extension portion extending in a first extending direction and a second extension portion extending in a second extending direction different from the first extending direction. The first extension portion and the second extension portion intersect each other at an intersection portion which is a portion of the conductive pattern layer. The disconnection area is formed adjacent to the intersection portion.

In an embodiment, the first extension portion includes a (1-1)th extension portion disposed at one side of the intersection portion with respect to the first extending direction and a (1-2)th extension portion disposed at a second side of the intersection portion with respect to the first extending direction. The second extension portion includes a (2-1)th extension portion disposed at a first side of the intersection portion with respect to the second extending direction and a (2-2)th extension portion disposed at a second side of the intersection portion with respect to the second extending direction. The disconnection area is formed at one or more of the (1-1)th extension portion, the (1-2)th extension portion, the (2-1)th extension portion, and the (2-2)th extension portion.

In an embodiment, widths of the (1-1)th extension portion, the (1-2)th extension portion, the (2-1)th extension portion, and the (2-2)th extension portion are about equal to one another.

In an embodiment, each of the pixels includes a plurality of sub-pixels, including a first sub-pixel forming a first sub-pixel area in which light of a first color is provided, a second sub-pixel forming a second sub-pixel area in which light of a second color is provided, and a third sub-pixel forming a third sub-pixel area in which light of a third color is provided. The first sub-pixel area and the second sub-pixel area are adjacent to the third sub-pixel area in a first direction. The first sub-pixel area and the second sub-pixel area are adjacent to each other in a second direction different from the first direction. The cover layer is provided in a plurality, and is arranged in a matrix structure along the first direction and the second direction.

In an embodiment, a position at which the disconnection area is formed is defined with respect to each of the pixels, and the disconnection area is repeatedly formed according to a predetermined reference as the pixels are repeatedly patterned.

In an embodiment, the disconnection area is disposed on a first virtual line and a second virtual line, each of which extends in the second direction, and is not disposed on a middle virtual line between the first virtual line and the second virtual line. The first virtual line is a line on which a portion of the second conductive pattern layer disposed adjacent to the first sub-pixel area and a first side of the third sub-pixel area extends. The second virtual line is a line on which another portion of the second conductive pattern layer disposed adjacent to the second sub-pixel area and the second side of the third sub-pixel area extends. The middle virtual line extends in the second direction, penetrates the third sub-pixel area, and is disposed between the first sub-pixel area and the second sub-pixel area. The first sub-pixel area and the second sub-pixel area form a first pixel column, and the third sub-pixel area forms a second pixel column adjacent to the first pixel column along the second direction. The disconnection area is disposed between the first pixel column and the second pixel column.

In an embodiment, the second conductive pattern layer includes a protrusion portion extending in the second direction, the protrusion portion being adjacent to the third sub-pixel area along the first direction and overlapping the second sub-pixel area along the second direction.

In an embodiment, the first sub-pixel area is spaced apart from the second conductive pattern layer at a first distance in the plan view, the second sub-pixel area is spaced apart from the second conductive pattern layer at a second distance in the plan view, and the third sub-pixel area is spaced apart from the second conductive pattern layer at a third distance in the plan view. The first distance, the second distance, and the third distance are about equal to one another.

In an embodiment, the display part includes an anode electrode, a cathode electrode, and a light emitting part electrically connected between the anode electrode and the cathode electrode. The light emitting part includes a first light emitting part included in the first sub-pixel that emits light of the first color, a second light emitting part included in the second sub-pixel that emits light of the second color, and a third light emitting part included in the third sub-pixel that emits light of a third color.

In an embodiment, the second sub-pixel area includes a plurality of second sub-pixel areas adjacent to each other in the second direction. A width of a portion of the second conductive pattern layer disposed between the adjacent second sub-pixel areas is wider than a width of another portion of the second conductive pattern layer disposed between the first sub-pixel area and the second sub-pixel area. In the plan view, the second bridge is disposed between the adjacent second sub-pixel areas, and is covered by the cover layer.

In an embodiment, the second sub-pixel area is one of a plurality of second sub-pixel areas adjacent to each other in the second direction. The second conductive pattern layer is not disposed between the adjacent second sub-pixel areas.

In accordance with an embodiment of the disclosure, a display device includes a display part formed on a base layer, the display part including a plurality of pixels, and a sensor part disposed on the display part, the sensor part including a conductive pattern layer forming a sensing electrode and a cover layer disposed on the conductive pattern layer. The conductive pattern layer includes a first extension portion extending in a first extending direction and a second extension portion extending in a second extending direction different from the first extending direction. The first extension portion and the second extension portion intersect each other at an intersection portion which is a portion of the conductive pattern layer. At least a portion of the first extension portion is removed in an area directly adjacent to the intersection portion and forms a disconnection area. The cover layer is in contact with a portion of the conductive pattern layer, and entirely covers the disconnection area.

In accordance with an embodiment of the disclosure, a display device includes a display part formed on a base layer, the display part including a plurality of pixels, and a sensor part disposed on the display part, the sensor part including a conductive pattern layer forming a sensing electrode and a cover layer disposed on the conductive pattern layer. Each of the pixels includes a plurality of sub-pixels, including a first sub-pixel forming a first sub-pixel area in which light of a first color is provided, a second sub-pixel forming a second sub-pixel area in which light of a second color is provided, and a third sub-pixel forming a third sub-pixel area in which light of a third color is provided. The first sub-pixel area and the second sub-pixel area are adjacent to the third sub-pixel area in a first direction. The first sub-pixel area and the second sub-pixel area are adjacent to each other in a second direction different from the first direction. The conductive pattern layer includes a first conductive pattern layer and a second conductive pattern layer. The second conductive pattern layer forms at least a portion of the sensing electrode, and surrounds at least a portion of each of the first sub-pixel area, the second sub-pixel area, and the third sub-pixel area. At least a portion of the second conductive pattern layer is disconnected and forms a disconnection area. The cover layer includes a first cover layer disposed on the disconnection area and a second cover layer disposed on a portion of the second conductive pattern layer. The first cover layer and the second cover layer are arranged in a matrix structure.

BRIEF DESCRIPTION OF THE DRAWINGS

The above and other features of the present disclosure will become more apparent by describing in detail embodiments thereof with reference to the accompanying drawings.

DETAILED DESCRIPTION

Figure 1:
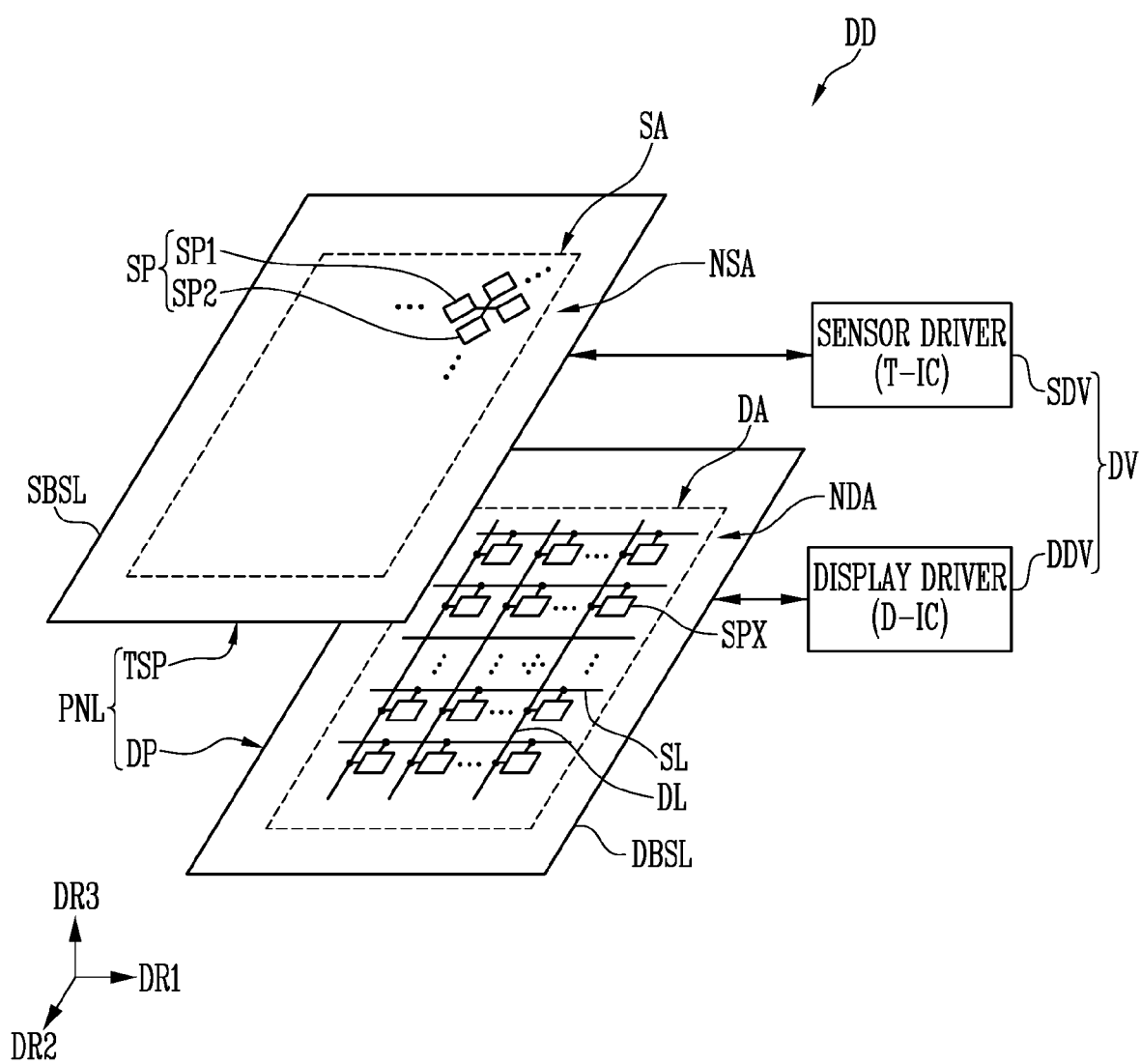
FIG. 1 is a view illustrating a display device in accordance with an embodiment of the disclosure.

Embodiments of the present disclosure will be described more fully hereinafter with reference to the accompanying drawings. Like reference numerals may refer to like elements throughout the accompanying drawings.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure.

As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

It should be understood that descriptions of features or aspects within each embodiment should typically be considered as available for other similar features or aspects in other embodiments, unless the context clearly indicates otherwise.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

Embodiments of the present disclosure generally relate to a display device including a touch sensor. Hereinafter, a display device including a touch sensor in accordance with embodiments of the disclosure will be described with reference to the accompanying drawings.

Figure 2:
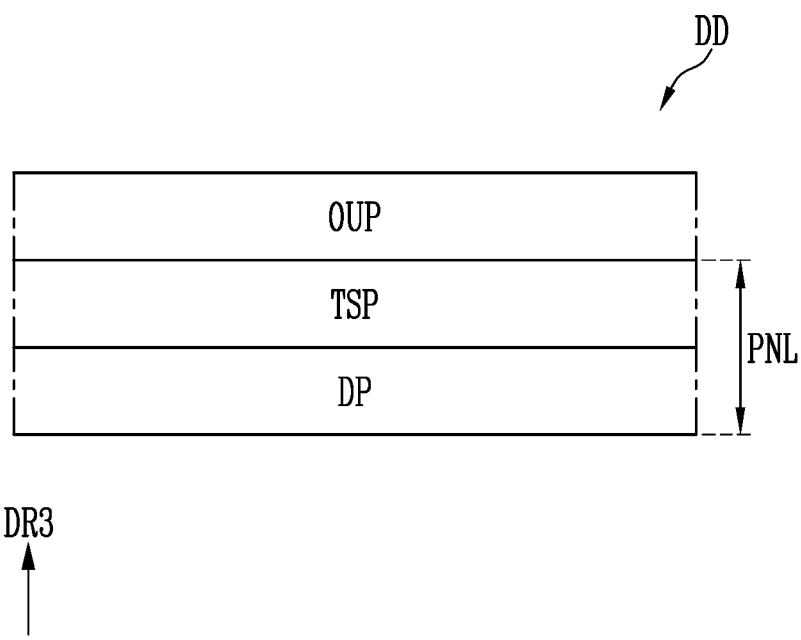
FIG. 2 is a schematic cross-sectional view illustrating a stacked structure of the display device in accordance with an embodiment of the disclosure.

FIG. 1 is a view illustrating a display device in accordance with an embodiment of the disclosure. FIG. 2 is a schematic cross-sectional view illustrating a stacked structure of the display device in accordance with an embodiment of the disclosure.

Referring to FIGS. 1 and 2, the display device DD is configured to provide (or emit) light. The display device DD may include a panel PNL and a driving circuit DV that drives the panel PNL. The display device DD may further include an outer part OUP.

The panel PNL may include a display part DP that displays an image and a sensor part TSP capable of sensing a user input (e.g., a touch input). The display part DP may be, for example, a display panel. The sensor part TSP may be, for example, a sensing panel (e.g., a touch sensing panel).

The panel PNL may include sub-pixels SPX and sensing electrodes SP. In some embodiments, the sub-pixels SPX may display an image by using a display frame period as a unit. The sensing electrodes SP may sense an input (e.g., a touch input) of a user by using a sensing frame period as a unit. The sensing frame period and the display frame period may be independent from each other or be different from each other. The sensing frame period and the display frame period may be synchronized with each other or be unsynchronized.

The sensor part TSP may acquire information on a touch input of the user. The sensing electrodes SP may include a first sensing electrode SP1 that provides a first sensing signal and a second sensing electrode SP2 that provides a second sensing signal. In accordance with an embodiment (e.g., a mutual capacitance type), the first sensing electrode SP1 may be a transmitter (Tx) pattern electrode, and the second sensing electrode SP2 may be a receiver (Rx) pattern electrode. Information on a touch input (or touch event) may mean, for example, including the position of a touch which the user is to provide.

However, the disclosure is not limited thereto. For example, in accordance with an embodiment (e.g., a self-capacitance type), the sensing electrodes SP may be configured with one type of sensing electrodes without distinguishing the first and second sensing electrodes SP1 and SP2 from each other.

The driving circuit DV may include a display driver DDV that drives the display part DP and a sensor driver SDV that drives the sensor part TSP.

The display part DP may include a display base layer DBSL and sub-pixels SPX provided on the display base layer DBSL. The sub-pixels SPX may be disposed in a display area DA.

The display base layer DBSL (or the display device DD) may include the display area DA in which an image is displayed, and a non-display area NDA (e.g., an area except the display area DA) in which an image is not displayed. In some embodiments, the display area DA may be disposed in a central area of the display part DP, and the non-display area NDA may be disposed adjacent to the periphery of the display area DA. However, the disclosure is not limited thereto.

The display base layer DBSL may be a base substrate or a base member, which is used to support the display device DD. The display base layer DBSL may be a rigid substrate made of glass. For example, the display base layer DBSL may be a flexible substrate which is bendable, foldable, rollable, and the like. The display base layer DBSL may include an insulating material including a polymer resin such as, for example, polyimide. However, the disclosure is not particularly limited thereto.

Scan lines SL and data lines DL, and the sub-pixels SPX connected to the scan lines SL and the data lines DL, are disposed in the display area DA. The sub-pixels SPX may be selected by a scan signal having a turn-on level, which is supplied from the scan lines SL, to be supplied with a data signal from the data lines DL, and emit light with a luminance corresponding to the data signal. Accordingly, an image corresponding to the data signal is displayed in the display area DA. However, in the disclosure, the structure, driving method, and the like of the sub-pixels SPX are not particularly limited.

Various types of lines and/or a built-in circuit, connected to the sub-pixels SPX of the display area DA, may be disposed in the non-display area NDA. For example, a plurality of lines that supply various power sources and various control signals to the display area DA may be disposed in the non-display area NDA.

The display part DP may output visual information (e.g., an image). In some embodiments, the type/kind of the display part DP is not particularly limited. For example, the display part DP may be implemented as a self-luminescent display panel such as an organic light emitting display panel. However, when the display part DP is implemented as a self-luminescent display panel, each pixel is not necessarily limited to a case in which the pixel includes only an organic light emitting element. For example, a light emitting element of each pixel may be configured as an organic light emitting diode, an inorganic light emitting diode, a quantum dot/well light emitting diode, or the like. In some embodiments, the display part DP may be implemented as a non-light emitting display panel such as a liquid crystal display panel. When the display part DP is implemented as a non-light emitting display panel, the display device DD may additionally include a light source such as a back-light unit.

Hereinafter, for convenience of description, an embodiment in which the display part DP is implemented as an organic light emitting display panel will be mainly described.

The sensor part TSP may include a sensor base layer SBSL and a plurality of sensing electrodes SP formed on the sensor base layer SBSL. The sensing electrodes SP may be disposed in a sensing area SA on the sensor base layer SBSL.

The sensor base layer SBSL (or the display device DD) may include the sensing area SA capable of sensing a touch input or the like, and a non-sensing area NSA disposed at the periphery of the sensing area SA. In some embodiments, the sensing area SA may be disposed to overlap at least one area of the display area DA. For example, the sensing area SA may be set as an area corresponding to the display area DA (e.g., an area overlapping the display area DA), and the non-sensing area NSA may be set as an area corresponding to the non-display area NDA (e.g., an area overlapping the non-display area NDA). When a touch input or the like is provided on the display area DA, the touch input may be detected through the sensor part TSP.

The sensor base layer SBSL may include at least one insulating layer (e.g., a first insulating layer INS1 (see FIG. 4)). For example, the first insulating layer INS1 that forms the sensor base layer SBSL may be disposed on the display part DP, to form a base for allowing the sensing electrodes SP to be formed thereon. However, forming the sensing base layer SBSL is not particularly limited.

The sensing area SA is set as an area capable of reacting with a touch input (e.g., an active area of sensors). To this end, sensing electrodes SP that sense a touch input or the like may be disposed in the sensing area SA.

The sensor part TSP may acquire information on an input provided from the user. The sensor part TSP may recognize a touch input. The sensor part TSP may recognize a touch input by using a capacitive sensing type. The sensor part TSP may sense a touch input by using a mutual capacitance type or sense a touch input by using a self-capacitance type.

In some embodiments, each of the first sensing electrodes SP1 may extend in a first direction DR1. The first sensing electrodes SP1 may be arranged in a second direction DR2. The second direction DR2 may be different from the first direction DR1. For example, the second direction DR2 may be a direction orthogonal to the first direction DR1.

In some embodiments, each of the second sensing electrodes SP2 may extend in the second direction DR2. The second sensing electrodes SP2 may be arranged in the first direction DR1.

In some embodiments, the first sensing electrodes SP1 and the second sensing electrodes SP2 may have the same (e.g., the substantially same) shape. For example, the first sensing electrodes SP1 as TX pattern electrodes and the second sensing electrodes SP2 as Rx pattern electrodes may have shapes corresponding to each other (e.g., the substantially same shape), and accordingly, the sensing performance of a touch event in the sensing area SA can be uniformly set.

Sensing lines that electrically connect the sensing electrodes SP to the sensor driver SDV or the like may be disposed in the non-sensing area NSA of the sensor part TSP.

The driving circuit DV may include a display driver DDV that drives the display part DP and a sensor driver SDV that drives the sensor part TSP.

The display driver DDV is electrically connected to the display part DP to drive the sub-pixels SPX. The sensor driver SDV is electrically connected to the sensor part TSP to drive the sensor part TSP.

The outer part OUP may be roughly disposed at an outer portion of the display device DD. The outer part OUP may be disposed on the sensor part TSP. Light provided from the display part DP may be output to the outside of the display device DD while passing through the outer part OUP. In some embodiments, the outer part OUP may include a window. In some embodiments, the outer part OUP may include a reflection control layer RCL (see FIG. 12) and a light blocking layer LBL (see FIG. 12).

Figure 3:
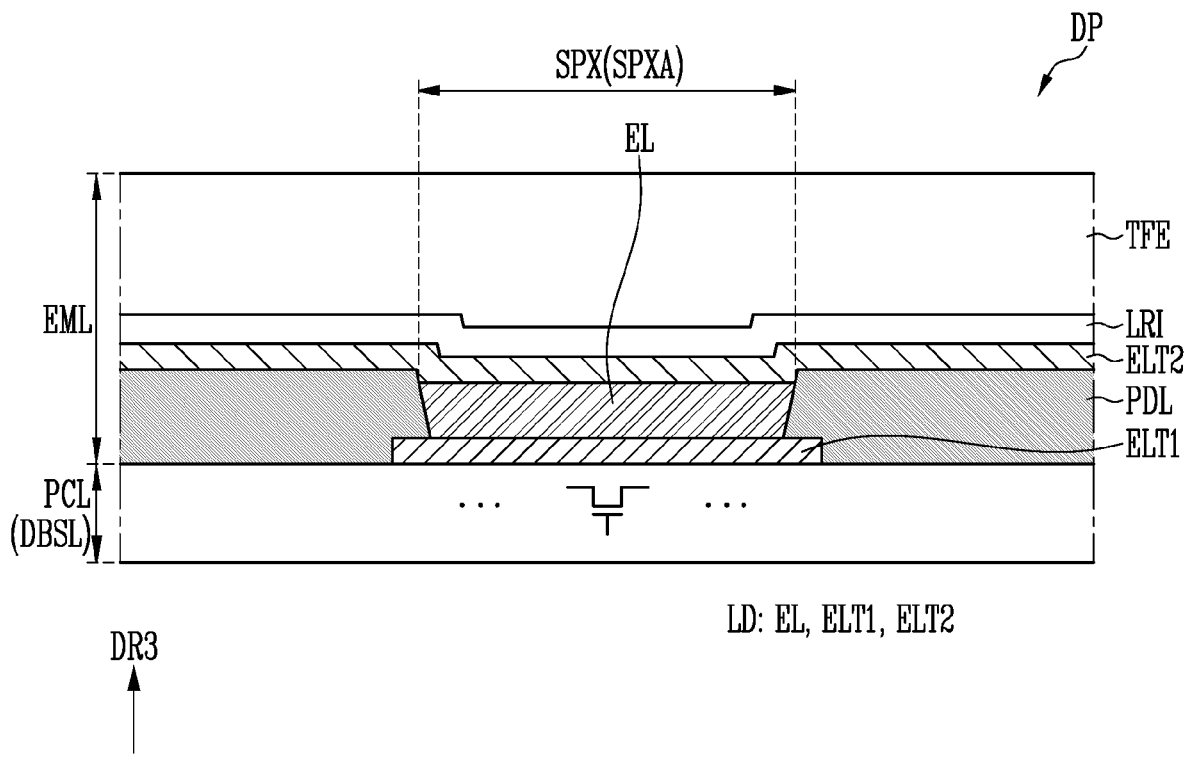
FIG. 3 is a schematic cross-sectional view illustrating a display part in accordance with an embodiment of the disclosure.

A display part DP in accordance with an embodiment of the disclosure will be described with reference to FIG. 3. FIG. 3 is a schematic cross-sectional view illustrating a display part in accordance with an embodiment of the disclosure.

Referring to FIG. 3, the display part DP may include a pixel circuit layer PCL and a light emitting element layer EML.

The pixel circuit layer PCL may include a pixel circuit that drives light emitting elements LD. The pixel circuit layer PCL may include a display base layer DBSL, conductive layers that form pixel circuits, and insulating layers disposed between the conductive layers.

The pixel circuit may include a thin film transistor. The pixel circuit may include a driving transistor. The pixel circuit may be electrically connected to the light emitting elements LD to provide an electrical signal for allowing the light emitting elements LD to emit light.

The light emitting element layer EML may be disposed on the pixel circuit layer PCL. In some embodiments, the light emitting element layer EML may include a light emitting element LD, a pixel defining layer PDL, a low reflection inorganic layer LRI, and an encapsulation layer TFE.

The light emitting element LD may be disposed on the pixel circuit layer PCL. In some embodiments, the light emitting element LD may include a first electrode ELT1, a light emitting layer EL, and a second electrode ELT2. In some embodiments, the light emitting layer EL may be disposed in an area defined by the pixel defining layer PDL. The pixel defining layer PDL may be adjacent to the periphery of the light emitting layer EL. A surface of the light emitting layer EL may be electrically connected to the first electrode ELT1, and another surface of the light emitting element EL may be electrically connected to the second electrode ELT2.

The first electrode ELT1 may be an anode electrode with respect to the light emitting layer EL, and the second electrode ELT2 may be a common electrode (or cathode electrode) with respect to the light emitting element EL. In some embodiments, the first electrode ELT1 and the second electrode ELT2 may include a conductive material. For example, the first electrode ELT1 may include a conductive material having reflectivity, and the second electrode ELT2 may include a transparent conductive material. However, the disclosure is not limited thereto.

The light emitting layer EL may have a multi-layer thin film structure including a light generation layer. The light emitting layer EL may include a hole injection layer that injects holes, a hole transport layer that increases a hole recombination opportunity by suppressing movement of electrons which are excellent in transportability of holes and are not combined in a light generation layer, the light generation layer that emits light by recombination of the injected electrons and holes, a hole blocking layer that suppresses the movement of the holes that are not combined in the light generation layer, an electron transport layer that smoothly transports the electrons to the light generation layer, and an electron injection layer that injects the electrons. The light emitting layer EL may release light, based on an electrical signal provided from the first electrode ELT1 and the second electrode ELT2.

The light emitting layer EL may form a sub-pixel SPX. The light emitting layer EL may form a sub-pixel area SPXA in which light of a color is emitted. In a plan view, an area of the light emitting layer EL and the sub-pixel area SPXA may correspond to each other. For example, each light emitting layer EL may correspond to each sub-pixel area SPXA.

The pixel defining layer PDL may be disposed on the pixel circuit layer PCL, to define a position at which the light emitting layer EL is arranged. The pixel defining layer PDL may include an organic material. In some embodiments, the pixel defining layer PDL may include at least one of, for example, acrylic resin, epoxy resin, phenolic resin, polyamide resin, and polyimide resin. However, the disclosure is not limited thereto. For example, the pixel defining layer DPL may include an inorganic material.

The low reflection inorganic layer LRI may be disposed on the light emitting element LD (e.g., the second electrode ELT2). The low reflection inorganic layer LRI may be disposed between the encapsulation layer TFE and the light emitting element LD.

The low reflection inorganic layer LRI may include an inorganic material. For example, the low reflection inorganic layer LRI may include at least one of a metal and a metal compound by taking into consideration a refractive index and an absorption coefficient. The low reflection inorganic layer LRI may absorb light incident into the display device DD from outside of the display device DD, and decrease external light reflectivity. Accordingly, in embodiments, the low reflection inorganic layer LRI is included, and the display quality and visibility of the display device DD can be improved.

The encapsulation layer TFE may be disposed on the low reflection inorganic layer LRI. The encapsulation layer TFE may cancel step differences generated by the light emitting element LD, the low reflection inorganic layer LRI, and the pixel defining layer PDL. The encapsulation layer TFE may include a plurality of insulating layers covering the light emitting element LD. In some embodiments, the encapsulation layer TFE may have a structure in which an inorganic layer and an organic layer are alternately stacked. In some embodiments, the encapsulation layer TFE may be a thin film encapsulation layer.

A sensor part TSP in accordance with an embodiment of the disclosure will be described with reference to FIGS. 4 to 7.

Figure 4:
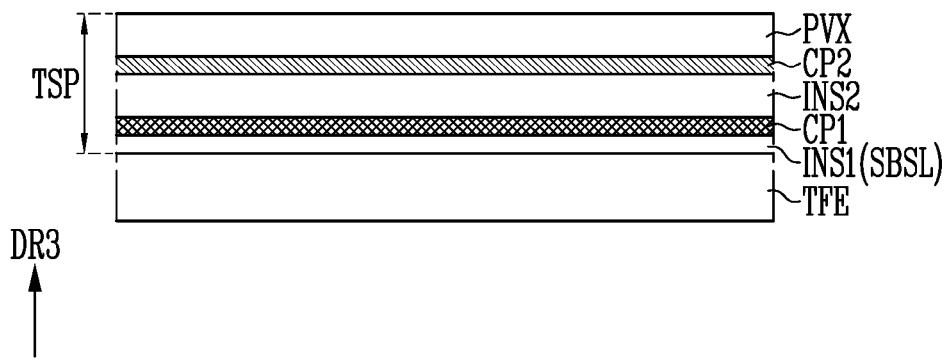
FIG. 4 is a schematic cross-sectional view illustrating a sensor part in accordance with an embodiment of the disclosure.
Figure 5:
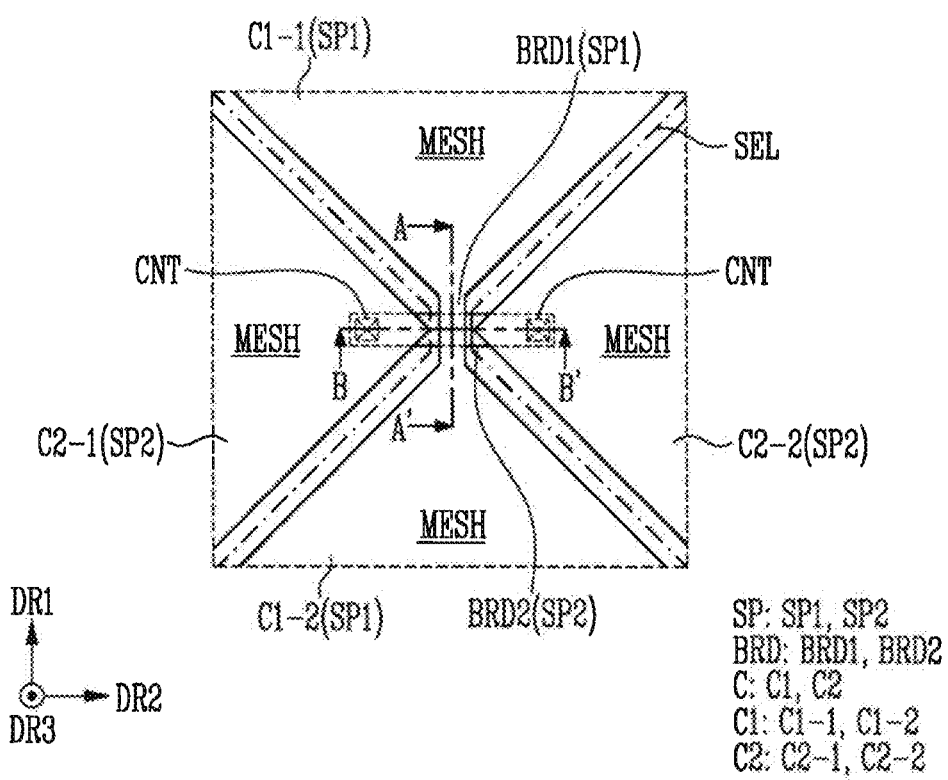
FIGS. 5 and 6 are schematic plan views illustrating sensing electrodes in accordance with an embodiment of the disclosure.
Figure 6:
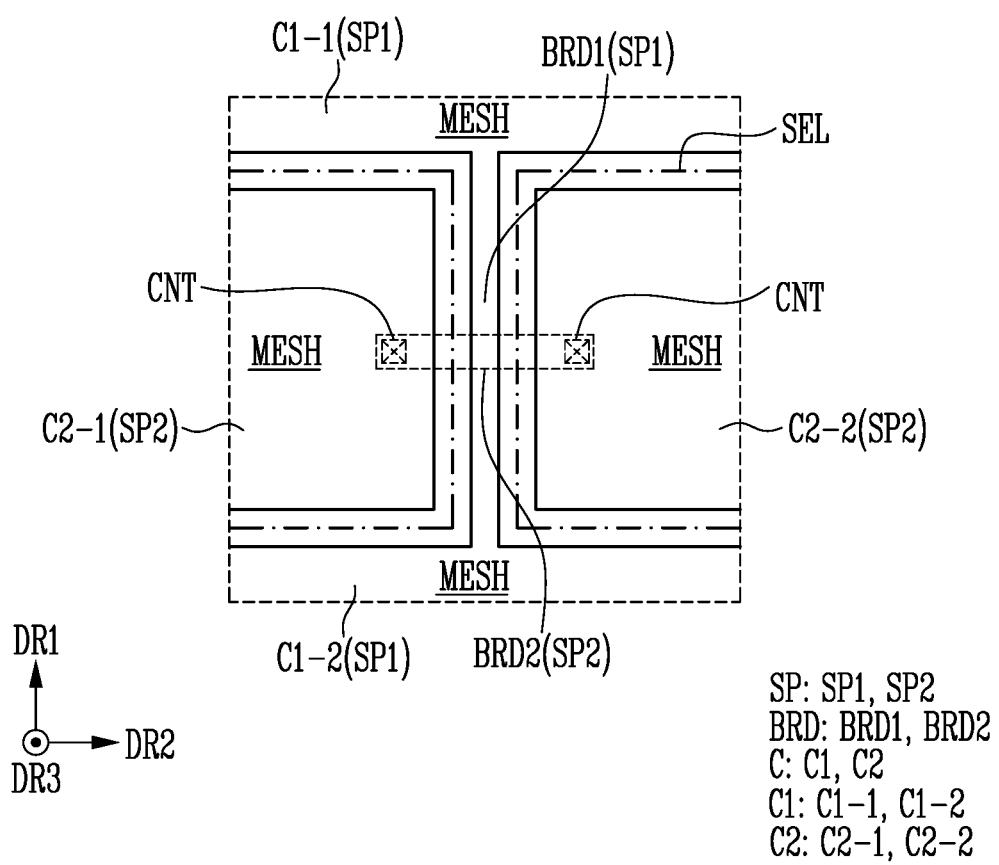
Figure 7:
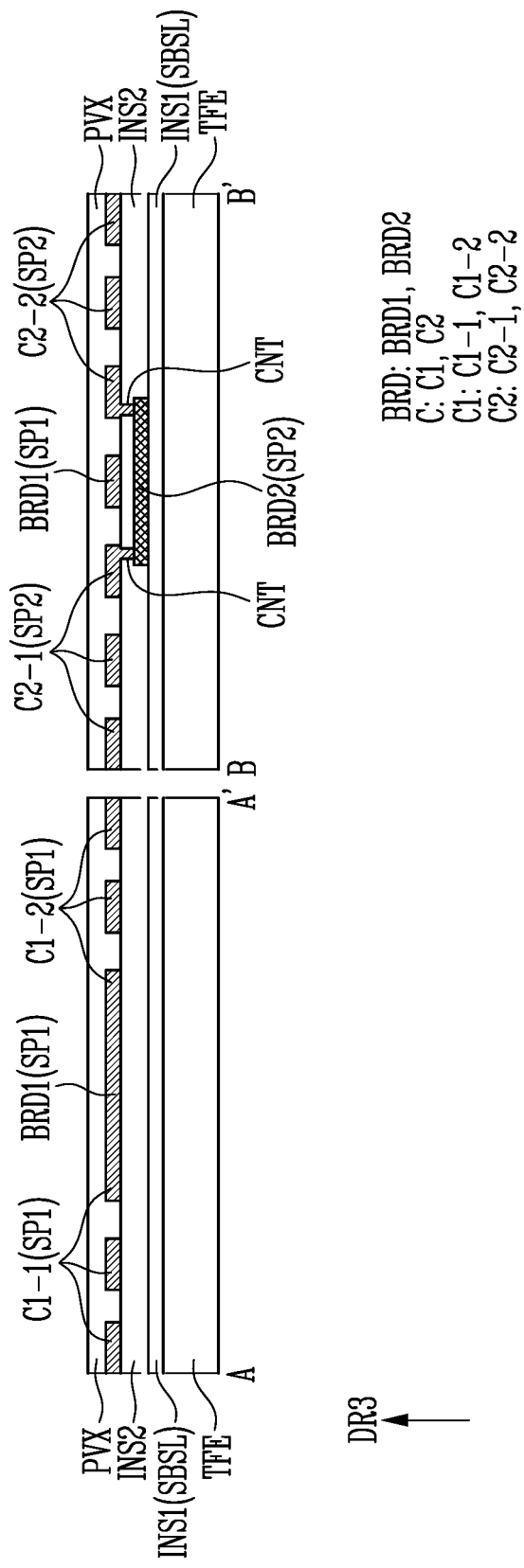
FIG. 7 is a schematic cross-sectional view illustrating a sensor part in accordance with an embodiment of the disclosure.

FIG. 4 is a schematic cross-sectional view illustrating a sensor part in accordance with an embodiment of the disclosure. FIGS. 5 and 6 are schematic plan views illustrating sensing electrodes in accordance with an embodiment of the disclosure. FIGS. 5 and 6 illustrate a schematic planar structure illustrating an area in which first and second sensing electrodes SP1 and SP2 are adjacent to each other. FIGS. 5 and 6 illustrate a planar structure of first and second sensing electrodes SP1 and SP2 each having a shape in accordance with an embodiment of the disclosure. FIG. 7 is a schematic cross-sectional view illustrating a sensor part in accordance with an embodiment of the disclosure. FIG. 7 illustrates a cross-sectional structure taken along line A-A' shown in FIG. 5 and a cross-sectional structure taken along line B-B' shown in FIG. 5.

Referring to FIGS. 4 to 7, the sensor part TSP may be disposed on the encapsulation layer TFE. The sensor part TSP may include a first insulating layer INS1, a first conductive pattern layer CP1, a second insulating layer INS2, a second conductive pattern layer CP2, and a protective layer PVX.

In some embodiments, the first conductive pattern layer CP1 and the second conductive pattern layer CP2 may be patterned in an area, to form sensing electrodes SP. For example, a portion of the first conductive pattern layer CP1 may constitute a first sensing electrode SP1, and a portion of each of the first conductive pattern layer CP1 and the second conductive pattern layer CP2 may form a second sensing electrode SP2. For example, a portion of the second conductive pattern layer CP2 may constitute a first sensing electrode SP1, and a portion of each of the first conductive pattern layer CP1 and the second conductive pattern layer CP2 may form a second sensing electrode SP2. However, the disclosure is not limited thereto.

The first insulating layer INS1 may be disposed on the encapsulation layer TFE. The first insulating layer INS1 may form a sensor base layer SBSL, thereby providing an area in which the first conductive pattern layer CP1, the second insulating layer INS2, the second conductive pattern layer CP2, and the protective layer PVX are disposed.

The first conductive pattern layer CP1 may be disposed on the first insulating layer INS1. The second conductive pattern layer CP2 may be disposed on the second insulating layer INS2. The first conductive pattern layer CP1 and the second conductive pattern layer CP2 may be spaced apart from each other with the second insulating layer INS2 interposed therebetween.

The first conductive pattern layer CP1 and the second conductive pattern layer CP2 may include a single- or multi-layer metal layer. The first conductive pattern layer CP1 and the second conductive pattern layer CP2 may include at least one of various metal materials including, for example, gold (Au), silver (Ag), aluminum (Al), molybdenum (Mo), chromium (Cr), titanium (Ti), nickel (Ni), neodymium (Nd), copper (Cu), platinum (Pt), and the like, or alloys thereof. In some embodiments, the first conductive pattern layer CP1 and the second conductive pattern layer CP2 may include at least one of various transparent conductive materials including one of, for example, silver nano wire (AgNW), Indium Tin Oxide (ITO), Indium Zinc Oxide (IZO), Indium Gallium Zinc Oxide (IGZO), Antimony Zinc Oxide (AZO), Indium Tin Zinc Oxide (ITZO), Zinc Oxide (ZnO), Tin Oxide ($SnO_2$), carbon nano tube, graphene, and the like.

The second insulating layer INS2 may be disposed on the first conductive pattern layer CP1. The second insulating layer INS2 may be interposed between the first conductive pattern layer CP1 and the second conductive pattern layer CP2. The protective layer PVX may be disposed on the second conductive pattern layer CP2.

The first insulating layer INS1 may include at least one of an inorganic material and an organic material. The second insulating layer INS2 may include at least one of an inorganic material and an organic material. In some embodiments, the protective layer PVX may include an organic material. The inorganic material may include at least one of, for example, silicon nitride ($SiN_x$), silicon oxide ($SiO_x$), silicon oxynitride ($SiO_xN_y$), and aluminum oxide ($AlO_x$). The organic material may include at least one of, for example, acrylic resin, epoxy resin, phenolic resin, polyamide resin, and polyimide resin. However, the disclosure is not limited thereto.

Sensing electrodes SP may include a cell C and a bridge BRD. The cell C may have a relatively wide area, and the bridge BRD may have a relatively narrow area. Cells C adjacent to each other may be electrically connected to each other by the bridge BRD. The cell C may include a first cell C1 and a second cell C2. The bridge BRD may include a first bridge BRD1 and a second bridge BRD2.

In some embodiments, the first cell C1 and the second cell C2 may be formed by the second conductive pattern layer CP2. The first bridge BRD1 may be formed by the second conductive pattern layer CP2. A portion of the second bridge BRD2 may be formed by the first conductive pattern layer CP1, and another portion of the second bridge BRD2 may be formed by the second conductive pattern layer CP2.

However, the disclosure is not necessarily limited thereto. For example, the first cell C1 and the second cell C2 may be formed by the first conductive pattern layer CP1. The first bridge BRD1 may be formed by the first conductive pattern layer CP1. A portion of the second bridge BRD2 may be formed by the second conductive pattern layer CP2, and another portion of the second bridge BRD2 may be formed by the first conductive pattern layer CP1.

In some embodiments, the sensing electrodes SP may have a mesh structure MESH. Cells C and bridges BRD may have the mesh structure. For example, the second conductive pattern layer CP2 that forms the sensing electrodes SP may be patterned according to the mesh structure. The sensing electrodes SP have the mesh structure, and as a result, capacitances of the sensing electrodes SP, which may be formed with other electrodes disposed under the cells C, can be reduced. The mesh structure may be defined as a disconnection area OPA (see FIG. 8), and the disconnection area OPA and a separation disconnection area SOPA (see FIG. 8) are formed in second conductive pattern layers CP2.

The first sensing electrode SP1 may have a structure in which first cells C1 having a relatively wide area and a first bridge BRD1 having a relatively narrow area are connected to each other. For example, the first cell C1 may include a (1-1)th cell C1-1 and a (1-2)th cell C1-2, and the first bridge BRD1 may electrically connect to the (1-1)th cell C1-1 and the (1-2)th cell C1-2 to each other.

The second sensing electrode SP2 may have a structure in which second cells C2 having a relatively wide area and a second bridge BRD2 having a relatively narrow area are connected to each other. For example, the second cell C2 may include a (2-1)th cell C2-1 and a (2-2)th cell C2-2, and the second bridge BRD2 may electrically connect the (2-1)th cell C2-1 and the (2-2)th cell C2-2 to each other.

In some embodiments, the second bridge BRD2 may be electrically connected to the (2-1)th cell C2-1 through a contact portion CNT, and be electrically connected to the (2-2)th cell C2-2 through another contact portion CNT. Accordingly, the second bridge BRD2 disposed in a layer different from a layer in which the second cell C2 is disposed may electrically connect the (2-1)th cell C2-1 and the (2-2)th cell C2-2 through the contact portions CNT. In some embodiments, the contact portion CNT may penetrate the second insulating layer INS2.

The first cell C1 and the second cell C2 may entirely have a diamond shape (FIG. 5). However, the shape of the first cell C1 and the second cell C2 is not particularly limited thereto. For example, the first cell C1 and the second cell C2 may entirely have a quadrangular shape (FIG. 6).

A separation line SEL may be defined between sensing electrodes SP electrically spaced apart from each other. For example, first sensing electrodes SP1 and second sensing electrodes SP2 may be adjacent to each other with the separation line SEL disposed therebetween. The separation line SEL may be a virtual line disposed in an area between the first sensing electrodes SP1 and the second sensing electrodes SP2. For example, the separation line SEL may be disposed (e.g., formed or defined) between the (1-1)th cell C1-1 and the (1-2)th cell C1-2. The separation line SEL may be disposed (e.g., formed or defined) between the first bridge BRD1 and the (1-2)th cell C1-2.

A cover layer COV and a disconnection area OPA in accordance with an embodiment of the disclosure will be described with reference to FIGS. 8 to 11.

Figure 8:
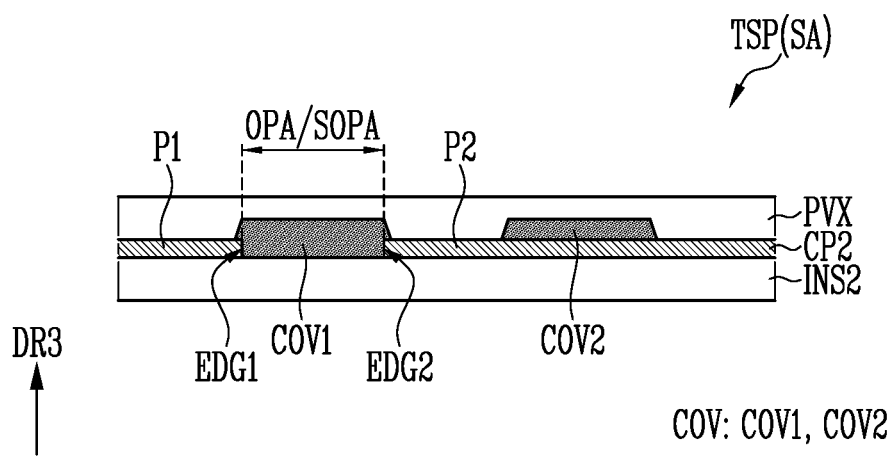
FIGS. 8 and 9 are schematic cross-sectional views illustrating a sensor part including a cover layer in accordance with an embodiment of the disclosure.
Figure 9:
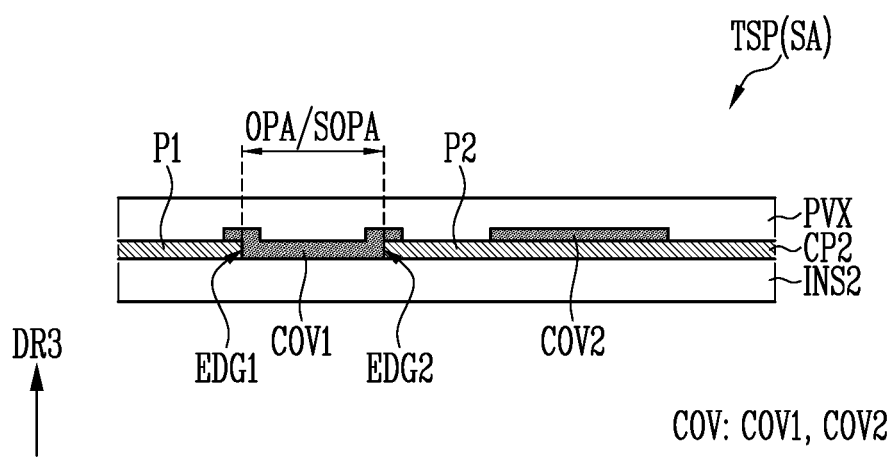
Figure 10:
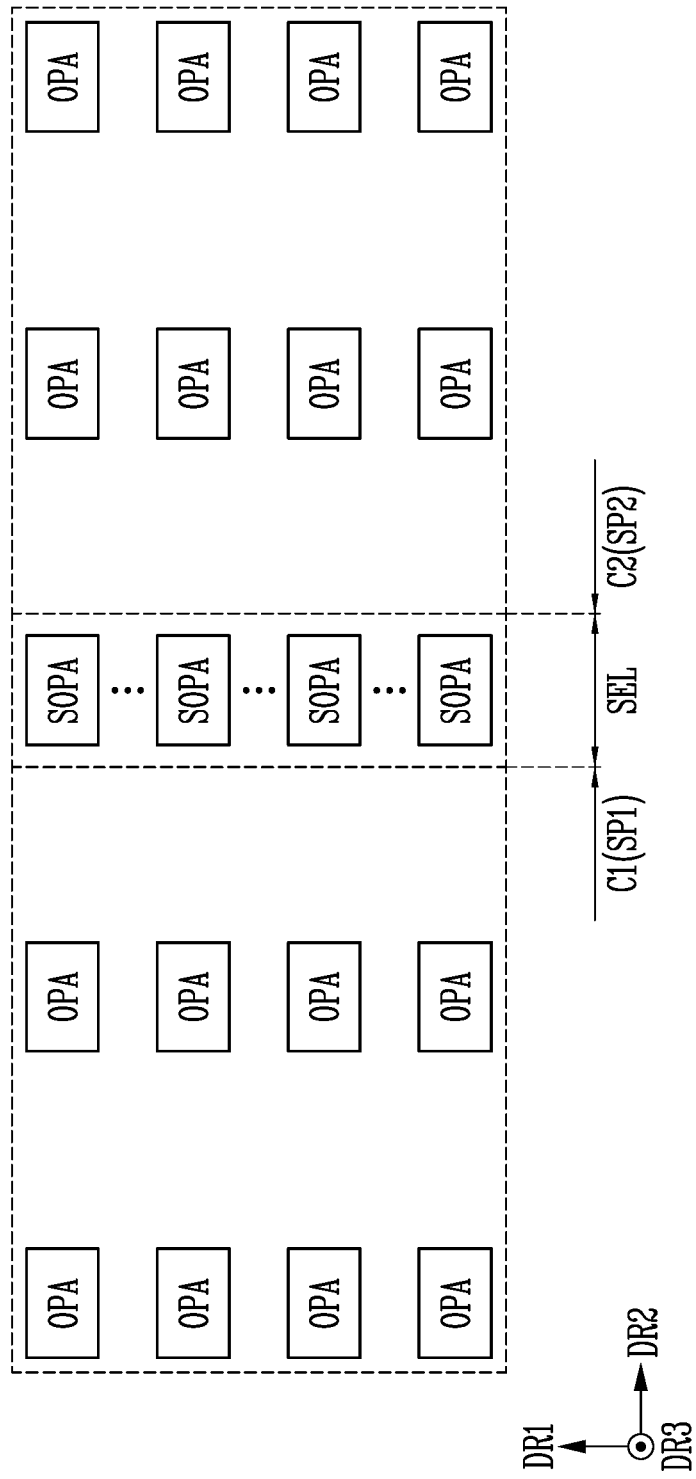
FIG. 10 is a schematic plan view illustrating an arrangement structure of a disconnection area and a separation disconnection area in accordance with an embodiment of the disclosure.
Figure 11:
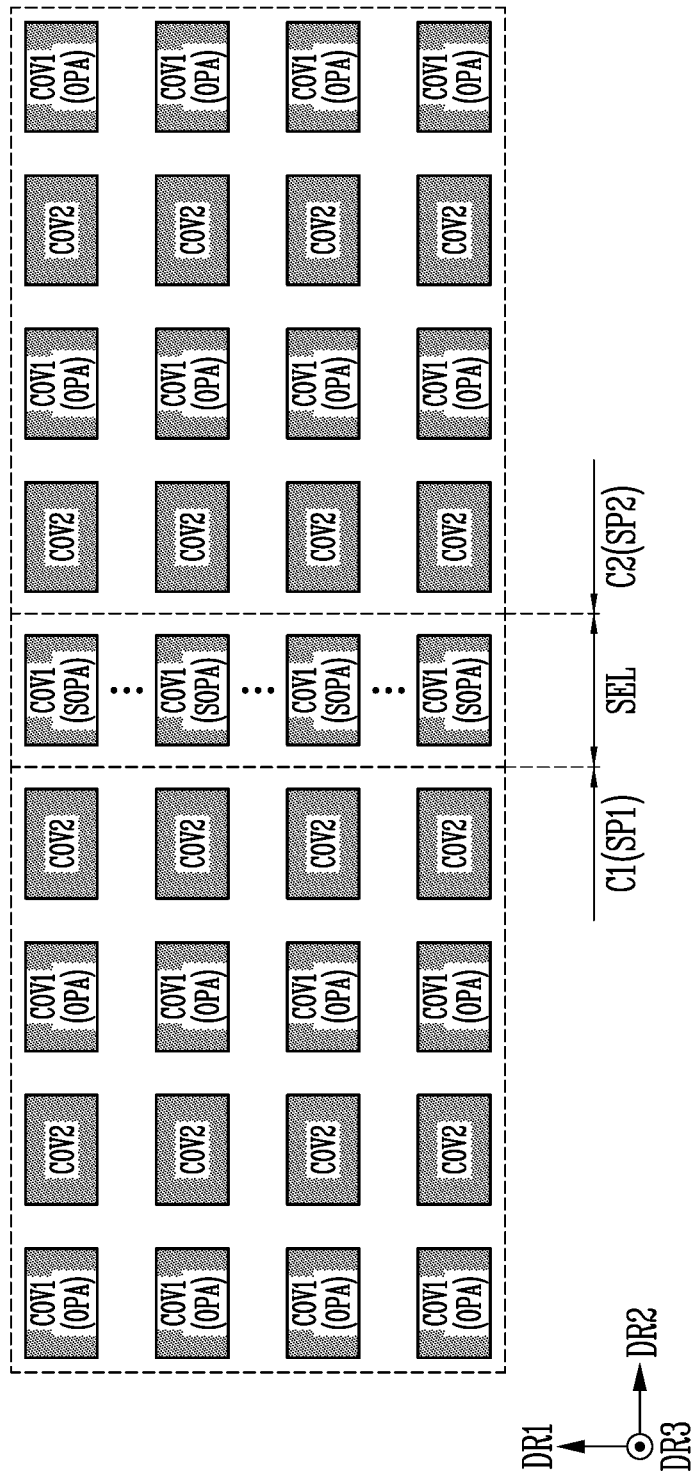
FIG. 11 is a schematic plan view illustrating an arrangement structure of a first cover layer and a second cover layer in relation to the disconnection area and the separation disconnection area in accordance with an embodiment of the disclosure.

FIGS. 8 and 9 are schematic cross-sectional views illustrating a sensor part including a cover layer in accordance with an embodiment of the disclosure. For convenience of description, FIGS. 8 and 9 illustrate the second conductive layer CP2 and the cover layer COV, which are disposed on the second insulating layer INS2. FIG. 10 is a schematic plan view illustrating an arrangement structure of a disconnection area and a separation disconnection area in accordance with an embodiment of the disclosure. FIG. 11 is a schematic plan view illustrating an arrangement structure of a first cover layer and a second cover layer in relation to the disconnection area and the separation disconnection area in accordance with an embodiment of the disclosure.

Referring to FIGS. 8 and 9, the sensor part TSP may further include a cover layer COV.

The cover layer COV may be selectively disposed at a portion in the sensing area SA. The cover layer COV may be disposed on the second insulating layer INS2. The cover layer COV may cover a portion of the second conductive pattern layer CP2.

The cover layer COV may be covered by the protective layer PVX. A top surface of the cover layer COV may be entirely covered by the protective layer PVX. For example, the top surface of the cover layer COV may be in contact with the protective layer PVX. A portion of the cover layer COV may be in contact with a portion of the second conductive pattern layer CP2.

In some embodiments, the cover layer COV may have a low reflectivity. For example, in an embodiment, the cover layer COV does not substantially reflect external light. Even when external light is applied to the display device DD, a risk that visibility will be decreased due to the external light can be reduced.

In some embodiments, the cover layer COV may include a material having a low reflectivity. For example, the cover layer COV may include a material which does not substantially reflect external light or reflects a minimum or substantially reduced amount of applied external light.

In some embodiments (see FIG. 8), the cover layer COV may include an organic material as the material having the low reflectivity. In some embodiments, when the cover layer COV includes an organic material, the cover layer COV may have a structure protruding in a third direction DR3 on the second insulating layer INS2. For example, the cover layer COV may include, as a black matrix material, at least one of a black pigment and a black dye. For example, the cover layer COV may include a carbon black color and the like. However, the disclosure is not limited thereto.

For example, in some embodiments (see FIG. 9), the cover layer COV may include an inorganic material as the material having the low reflectivity. In some embodiments, the cover layer COV may include a multi-layer or a single layer, which includes an inorganic material. However, the disclosure is not limited thereto.

The cover layer COV may include a first cover layer COV1 and a second cover layer COV2. The first cover layer COV1 and the second cover layer COV2 may be spaced apart from each other in a planar direction in which the first insulating layer INS is disposed (e.g., a direction in which a plane defined by the first direction DR1 and the second direction DR2 extends).

The first cover layer COV1 may be disposed on the second insulating layer INS2 in a disconnection area OPA. The first cover layer COV1 may overlap the disconnection area OPA in a plan view. The first cover layer COV1 may entirely cover the disconnection area OPA.

The first cover layer COV1 may be disposed on the second insulating layer INS2 in a separation disconnection area SOPA. The first cover layer COV1 may overlap the separation disconnection area SOPA in a plan view. The first cover layer COV1 may entirely cover the separation disconnection area SOPA.

In an embodiment, the second cover layer COV2 does not overlap the disconnection area OPA in a plan view. In an embodiment, the first cover layer COV1 may overlap the disconnection area OPA along the first direction DR1 and may overlap the disconnection OPA along the second direction DR2.

In some embodiments, the first cover layer COV1 and the second cover layer COV2 may overlap each other along the first direction DR1, and overlap each other along the second direction DR2. Accordingly, a risk that visibility will be decreased due to external light reflection can be reduced. An arrangement structure of the first cover layer COV1 and the second cover layer COV2 will be described below.

The disconnection area OPA may be a first opening area. The separation disconnection area SOPA may be a second opening area.

In an embodiment, the disconnection area OPA and the separation disconnection area SOPA do not overlap the second conductive pattern layer CP2 in a plan view. In an embodiment, the second conductive pattern layer CP2 is not disposed in the disconnection area OPA and the separation disconnection area SOPA.

Each of the disconnection area OPA and the separation disconnection area SOPA may be an area formed as a portion of the second conductive pattern layer CP2 is removed. Each of the disconnection area OPA and the separation disconnection area SOPA may be an area formed as a portion of the second conductive pattern layer CP2 is disconnected.

For example, a first part P1 of the second conductive pattern layer CP2 may have a first edge portion EDG1. A side portion of the first part P1 may be exposed at the first edge portion EDG1. A second part P2 of the second conductive pattern layer CP2 may have a second edge portion EDG2. A side portion of the second part P2 may be exposed at the second edge portion EDG2.

Each of the disconnection area OPA and the separation disconnection area SOPA may be an area between the first edge portion EDG1 and the second edge portion EDG2.

For example, the first part P1 may be a portion of the first sensing electrode SP1, the second part P2 may be a portion of the first sensing electrode SP1, and the disconnection area OPA may be defined inside of the first sensing electrode SP1 (e.g., inside of the first cell C1). The first part P1 may be a portion of the second sensing electrode SP2, the second part P2 may be a portion of the second sensing electrode SP2, and the disconnection area OPA may be defined inside of the second sensing electrode SP2 (e.g., inside of the second cell C2).

For example, the first part P1 may be a portion of the first sensing electrode SP1, the second part P2 may be a portion of the second sensing electrode SP2, and the separation disconnection area SOPA may be defined in an area in which the first sensing electrode SP1 and the second sensing electrodes SP2 are adjacent to each other. The separation disconnection area SOPA may correspond to (e.g., overlap) the separation line SEL in a plan view.

In some embodiments, disconnection areas OPA may be arranged in a matrix structure along the first direction DR1 and the second direction DR2. For example, the disconnection areas OPA may be sequentially arranged along the first direction DR1 (e.g., a column direction). The disconnection areas OPA may be sequentially arranged along the second direction DR2 (e.g., a row direction).

The disconnection areas OPA forming the matrix structure may be formed in the first sensing electrode (e.g., the first cell C1). The disconnection areas OPA forming the matrix structure may be formed in the second sensing electrode SP2 (e.g., the second cell C2).

In some embodiments, the separation disconnection area SOPA may be disposed between the disconnection areas OPA. For example, the separation disconnection area SOPA may be disposed between the disconnection areas OPA adjacent to each other along the second direction DR2. In some embodiments, the separation disconnection area SOPA may be disposed between the disconnection areas OPA adjacent to each other along the first direction DR1.

Separation disconnection areas SOPA may be sequentially arranged along a direction (e.g., the first direction DR1). The separation disconnection areas SOPA may be formed between the first sensing electrode SP1 (e.g., the first cell C1) and the second sensing electrode SP2 (e.g., the second cell C2). Accordingly, the separation disconnection area SOPA may form the separation line SEL.

In some embodiments, the separation disconnection areas SOPA along with the disconnection areas OPA may be arranged in a matrix structure. For example, the separation disconnection areas SOPA and the disconnection areas OPA may be sequentially arranged along the first direction DR1. The separation disconnection areas SOPA and the disconnection areas OPA may be sequentially arranged along the second direction DR2.

As described above, the first cover layer COV1 may be disposed on the disconnection areas OPA and the separation disconnection areas SOPA. Accordingly, the first cover layer COV may be patterned according to a reference (e.g., a matrix structure).

Besides, the second cover layer COV2 may be disposed on areas on which the disconnection areas OPA and the separation disconnection areas SOPA are not formed. The first cover layer COV1 and the second cover layer COV2 may be patterned according to a reference (e.g., a matrix structure).

Consequently, an arrangement structure in which cover layers COV (e.g., the first cover layer COV1 and the second cover layer COV2) are patterned can be entirely uniformly defined on the sensing area SA, and thus, a risk such as occurrence of external light due to the disconnection area OPA and the separation disconnection area SOPA can be prevented or reduced.

The disconnection area OPA and the separation disconnection area SOPA may be formed adjacent to each other at a point at which a portion extending in the first direction and another portion extending in the second direction intersect each other, among second conductive patterns CP2 patterned at a peripheral portion of an area in which the sub-pixel SPX (or the sub-pixel area SPXA) is formed. This will be described in detail in conjunction with an arrangement structure of the sub-pixels SPX.

Figure 12:
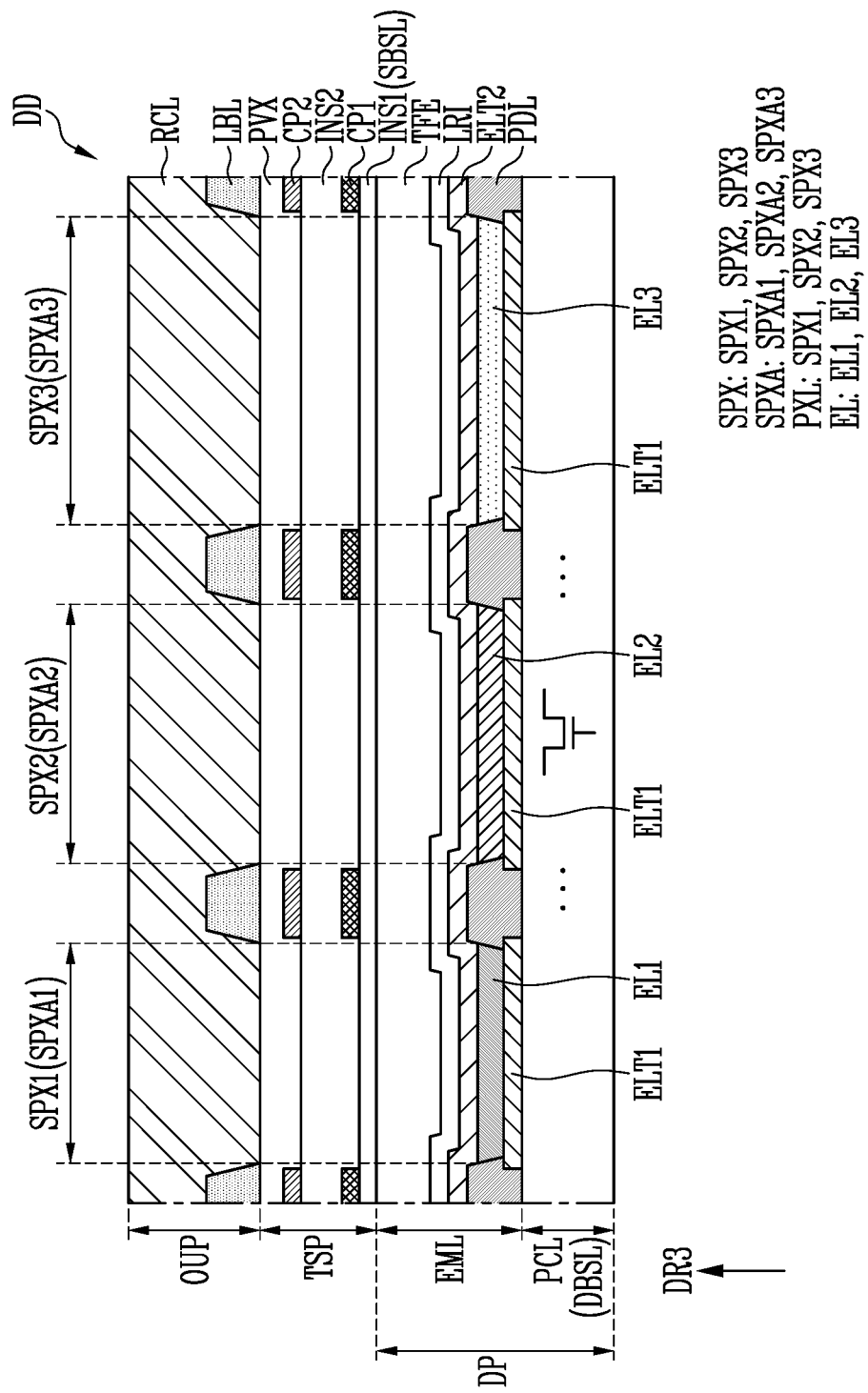
FIG. 12 is a schematic cross-sectional view illustrating a display device in accordance with an embodiment of the disclosure.

A cross-sectional structure of a display device DD in accordance with an embodiment of the disclosure is described below with reference to FIG. 12. FIG. 12 is a schematic cross-sectional view illustrating a display device in accordance with an embodiment of the disclosure.

Referring to FIG. 12, a light emitting layer EL may include a first light emitting layer EL1 included in a first sub-pixel SPX1, a second light emitting layer EL2 included in a second sub-pixel SPX2, and a third light emitting layer EL3 included in a third sub-pixel SPX3. The first light emitting layer EL1 may emit light of a first color (e.g., red), and form a first sub-pixel area SPXA1. The second light emitting layer EL2 may emit light of a second color (e.g., green), and form a second sub-pixel area SPXA2. The third light emitting layer EL3 may emit light of a third color (e.g., blue), and form a third sub-pixel area SPXA3.

A first conductive pattern layer CP1 and a second conductive pattern layer CP2 in a sensor part may be disposed in different layers, to form a structure of sensing electrodes SP.

An outer part OUP may be disposed on the sensor part TSP. The outer part OUP may allow at least a portion of light provided from the light emitting layer EL to be transmitted therethrough. In some embodiments, the outer part OUP may include a light blocking layer LBL and a reflection control layer RCL. However, the structure of the outer part OUP is not limited thereto. For convenience of description, the display device DD will be described based on an embodiment in which the outer part OUP includes the light blocking layer LBL and the reflection control layer RCL.

The light blocking layer LBL may overlap the first conductive pattern layer CP1 and the second conductive pattern layer CP2 in a plan view. The light blocking layer LBL may include a light blocking material, but the disclosure is not necessarily limited thereto.

The reflection control layer RCL may selectively absorb light having a wavelength range, thereby controlling a reflectivity and a color sense of the display device DD. In some embodiments, the reflection control layer RCL may include at least one of, for example, an oxazine-based compound, a cyanine-based compound, a tetrazoporphin-based compound, and a squarylium-based compound, but the disclosure is not limited thereto.

In some embodiments, sizes (or areas) of sub-pixel areas SPXA may be different from each other. Areas of the first sub-pixel area SPXA1, the second sub-pixel area SPXA2, and the third sub-pixel area SPXA3 may be different from one another. For example, an area of the third sub-pixel area SPXA3 may be greater than an area of the second sub-pixel area SPXA2. The area of the second sub-pixel area SPXA2 may be greater than an area of the first sub-pixel area SPXA1. However, the disclosure is not necessarily limited thereto. In some embodiments, the area of the second sub-pixel area SPXA2 and the area of the first sub-pixel area SPXA1 may be the same. Hereinafter, for convenience of description, the display device DD will be described based on an embodiment in which the area of the second sub-pixel area SPXA2 is greater than the area of the first sub-pixel area SPXA1.

In some embodiments, some sub-pixel areas SPXA may be manufactured to have different areas, and as a result, an emission efficiency deviation of the sub-pixel SPX for each color can be compensated.

In some embodiments, the outer part OUP does not include any color filter.

Referring to a comparative example, when a color filter is included in the display device DD, the entire thickness of the display device DD may be increased. In addition, when a color filter including a red color filter, a green color filter, and a blue color filter is included in the display device DD, the red color filter, the green color filter, and the blue color filter may be stacked, to form a light blocking structure for dividing the sub-pixel areas SPXA. The formed light blocking structure may have difficulty in being manufactured to have a narrow width. Therefore, a width of the sub-pixel areas SPXA may be decreased, or a distance between the sub-pixel areas SPXA may be extended. However, in accordance with an embodiment of the disclosure, as no color filter is included, the above-described risk can be prevented, and the display device DD having excellent visibility may be provided.

In some embodiments, the display part DP may further include a color conversion layer including a quantum dot, which can convert a color of applied light. The color conversion layer may be disposed above a light emitting element LD, and the position of the color conversion layer is not particularly limited.

Hereinafter, a structure of a first conductive pattern layer CP1, a second conductive pattern layer CP2, a cover layer COV, and sub-pixels SPX of a display device DD in accordance with an embodiment of the disclosure will be described with reference to FIGS. 13 to 23. For convenience of explanation, a further description of components and technical aspects previously described may be omitted.

A display device DD in accordance with an embodiment of the disclosure will be described with reference to FIGS. 13 to 19.

FIGS. 13 to 19 are schematic views illustrating a display device in accordance with an embodiment of the disclosure.

FIGS. 13 to 17 and 19 are schematic plan views illustrating a display device DD in accordance with an embodiment of the disclosure. FIG. 18 is a schematic cross-sectional view illustrating the display device DD in accordance with an embodiment of the disclosure.

Figure 13:
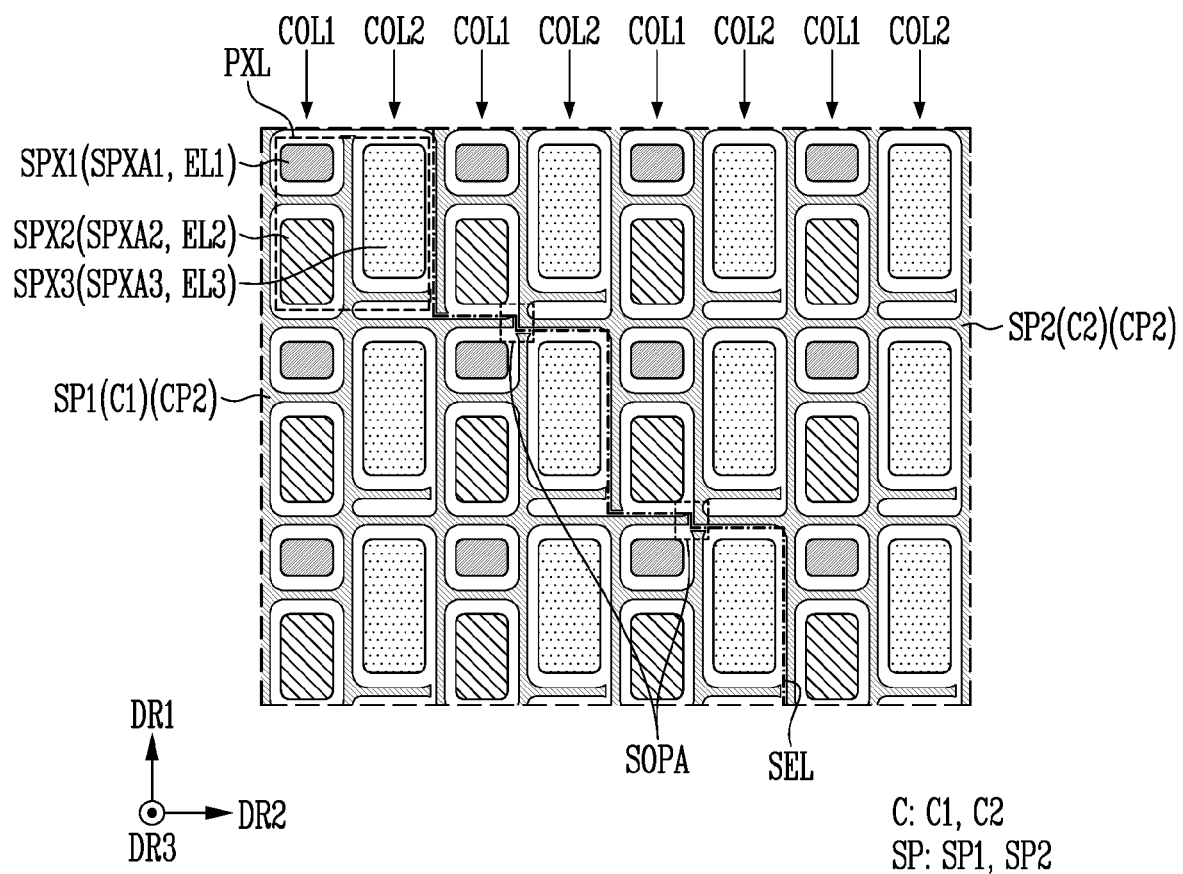
FIGS. 13 to 19 are schematic views illustrating a display device in accordance with an embodiment of the disclosure.
Figure 14:
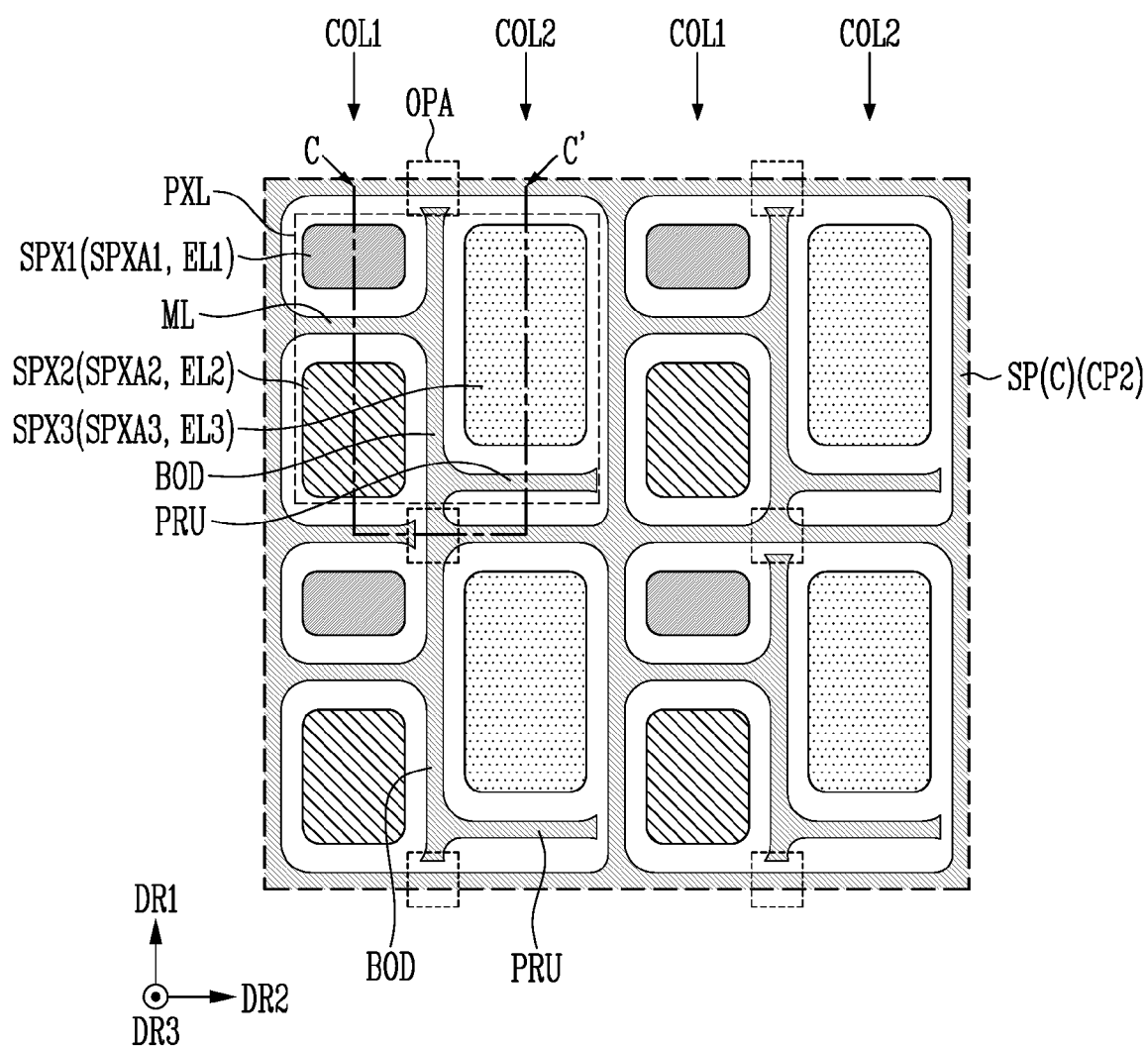
Figure 15:
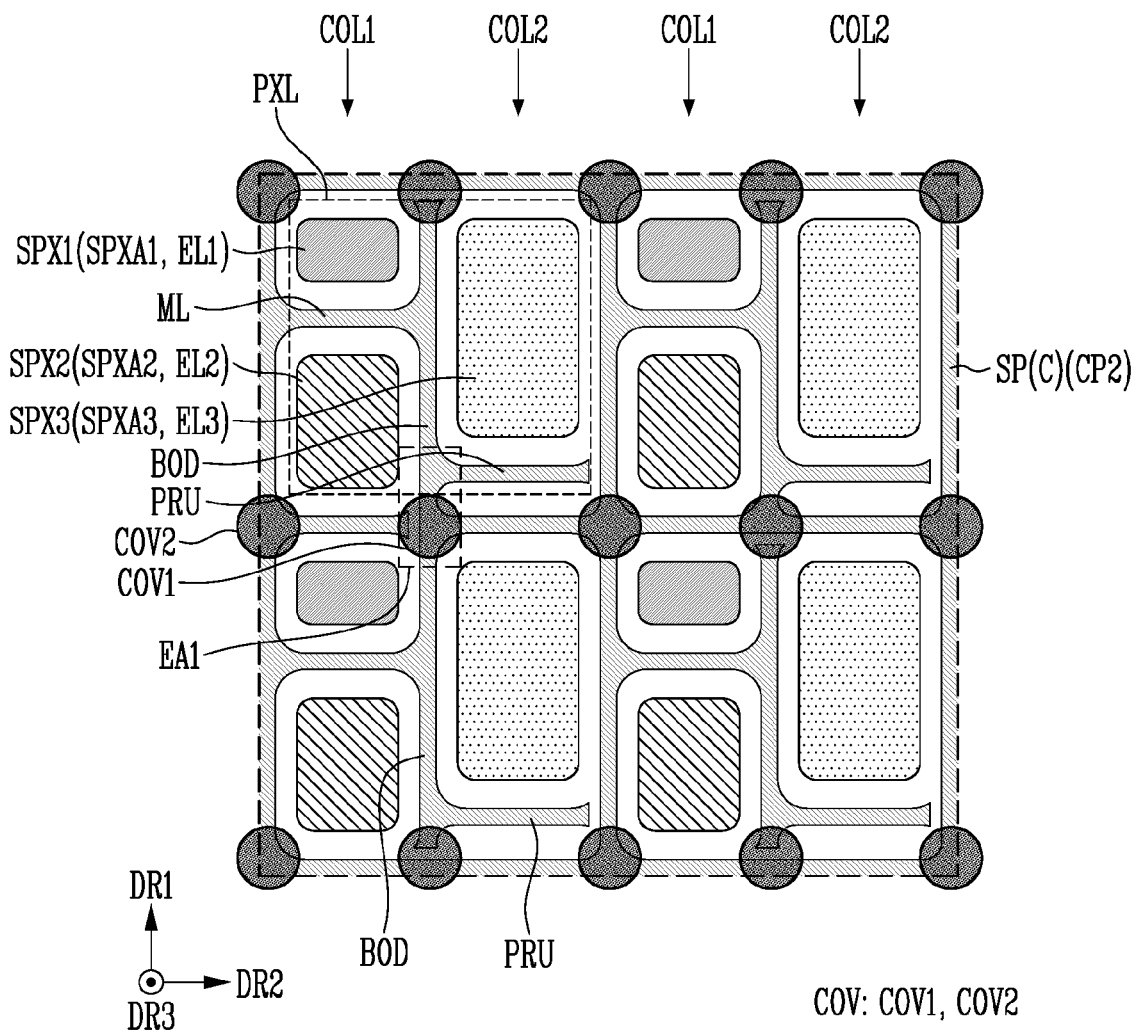
Figure 16:
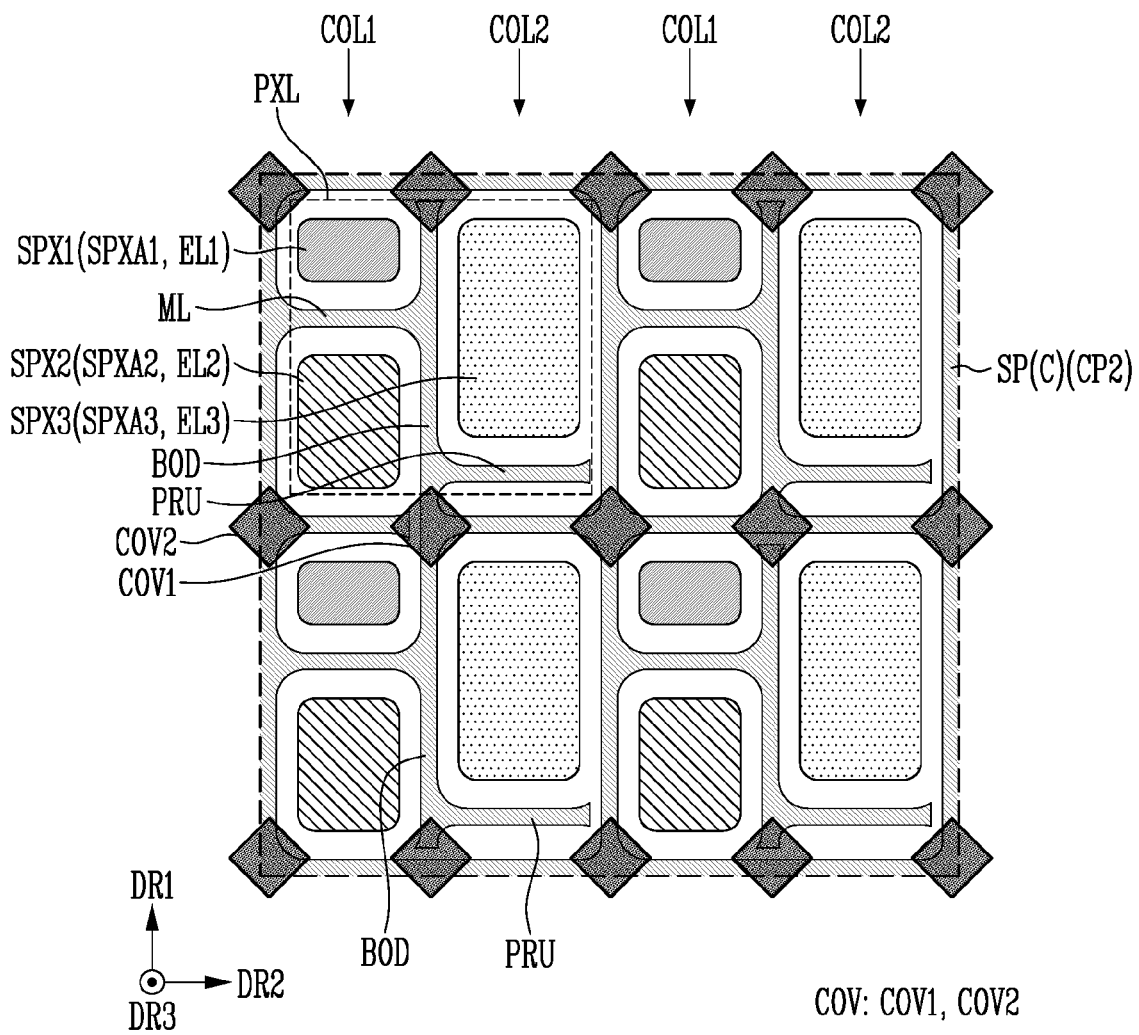
Figure 17:
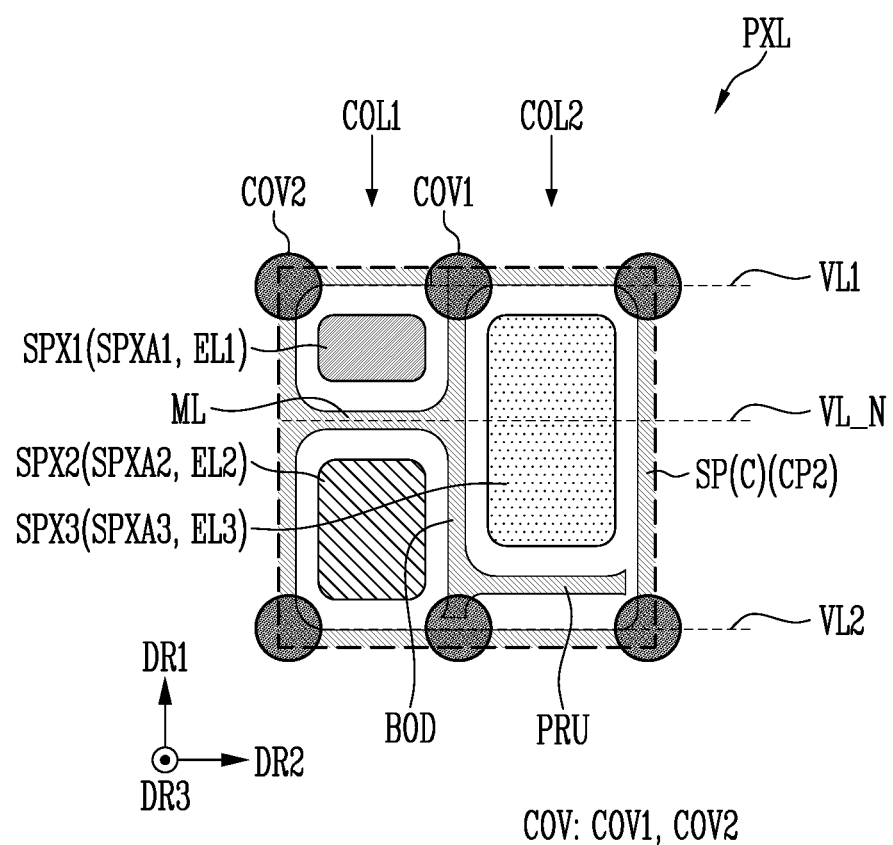
Figure 18:
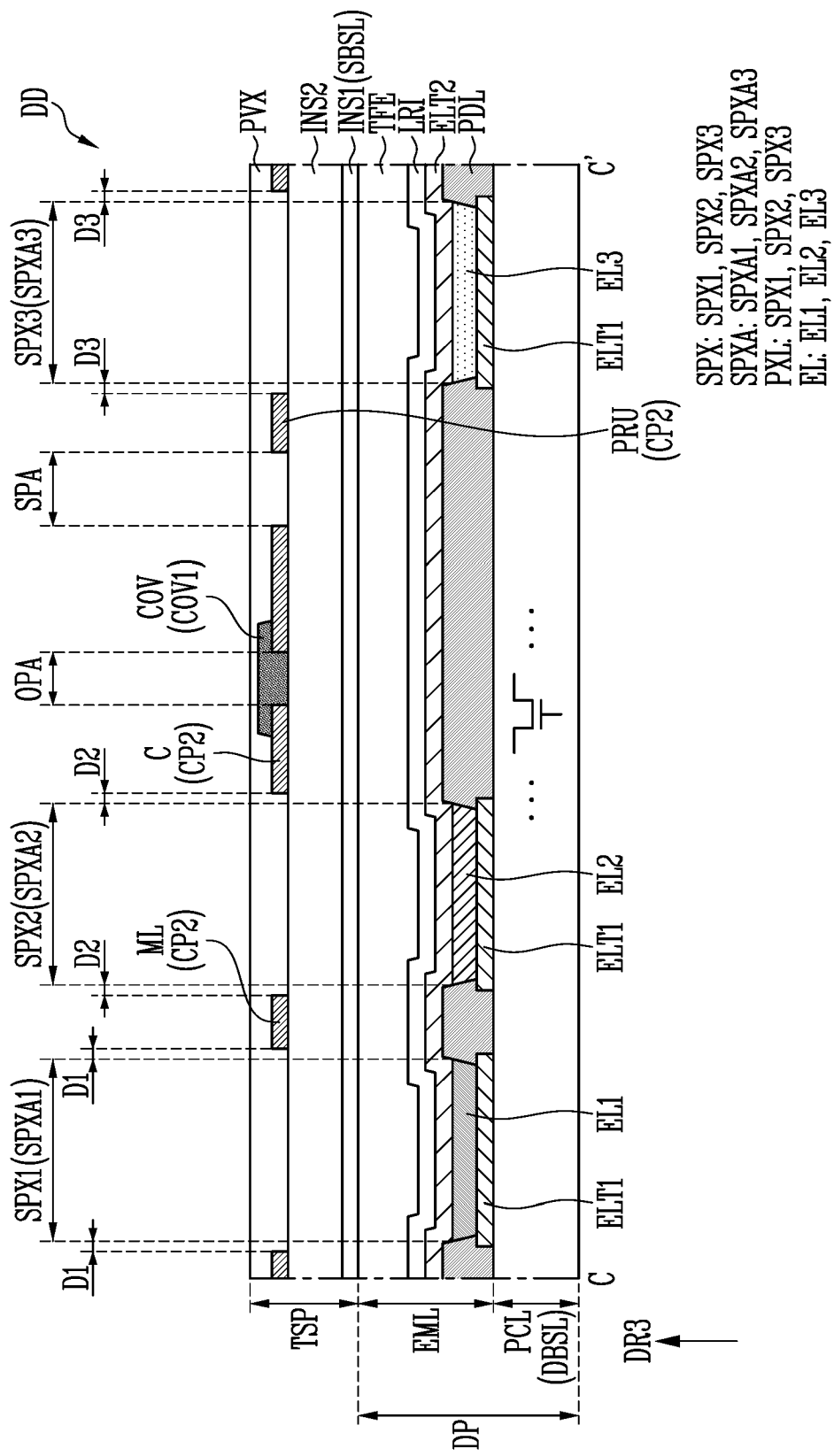
Figure 19:
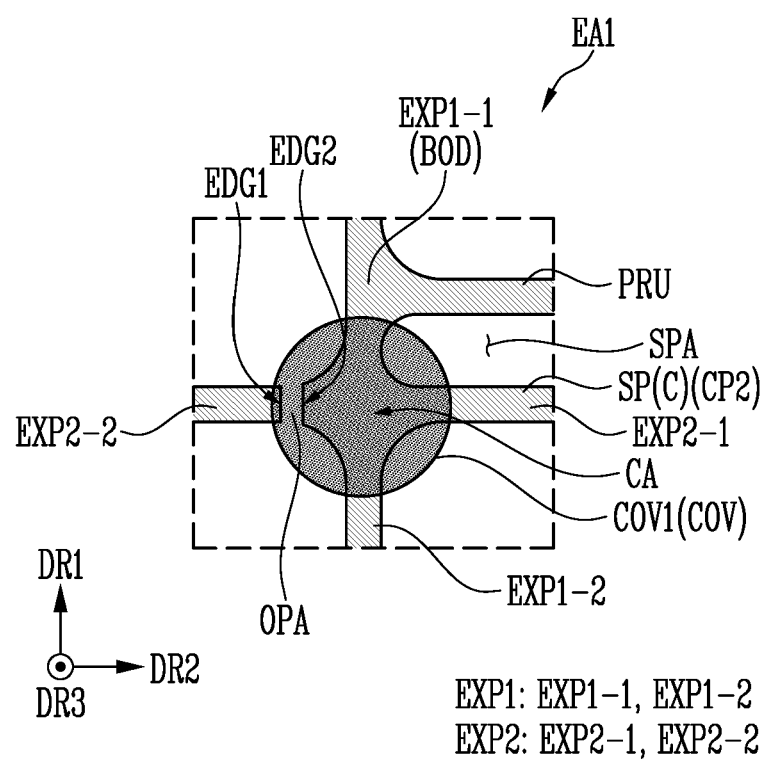

FIGS. 13 to 17 are schematic plan views illustrating sub-pixel areas SPXA and a second conductive pattern layer CP2. FIGS. 13 to 17 illustrate sub-pixels SPX1, SPX2, and SPX3 (or light emitting layers EL1, EL2, and EL3) forming sub-pixel areas SPXA1, SPXA2, and SPXA3, and illustrate the second conductive pattern layer CP2 formed at the periphery of the sub-pixel areas SPXA. FIG. 13 illustrates sensing electrodes SP1 and SP2 adjacent to each other with respect to a separation line SEL. FIGS. 16 and 17 further illustrate a cover layer COV disposed in areas adjacent to the sub-pixel areas SPXA. FIG. 18 is a schematic cut-away cross-sectional view taken along line C-C' shown in FIGS. 14 and 15. FIG. 19 is a schematic enlarged view illustrating an area in which a first cover layer COV1 is disposed. FIG. 19 is a schematic enlarged view of area EA shown in FIG. 15.

The sub-pixels SPX in accordance with an embodiment of the disclosure may be arranged according to a structure. For example, the sub-pixels SPX may be arranged according to an S-stripe structure. However, the disclosure is not necessarily limited thereto. The arrangement structure of the sub-pixels SPX may be variously implemented.

In the following description, a position relationship between the sub-pixels SPX1, SPX2, and SPX3 may correspond to a position relationship between the sub-pixel areas SPXA1, SPXA2, and SPXA3 and/or the light emitting layers EL1, EL2, and EL3.

First sub-pixels SPX1 and second sub-pixels SPX2 may form a first pixel column COL1. The first sub-pixels SPX1 and the second sub-pixels SPX2 may be sequentially disposed along the first direction DR1. The first sub-pixels SPX1 and the second sub-pixels SPX2 may be alternately disposed along the first direction DR1. No third sub-pixels SPX3 are disposed in the first column COL1, but the first sub-pixel SPX1 and the second sub-pixel SPX2 may be disposed in the first pixel column COL.

Third sub-pixels SPX3 may form a second pixel column COL2. The third sub-pixels SPX3 may be sequentially disposed along the first direction DR1. No first sub-pixels SPX1 and no second sub-pixels SPX2 are disposed in the second pixel column COL2, but the third sub-pixels SPX3 may be disposed in the second pixel column COL2.

The first pixel column COL1 and the second pixel column COL2 may be adjacent to each other along the second direction DR2. For example, the first sub-pixel SPX1 may be adjacent to the third sub-pixel SPX3 along the second direction DR2. The second sub-pixel SPX2 may be adjacent to the third sub-pixel SPX3 along the second direction DR2.

The first pixel column COL1 and the second pixel column COL2 may be alternately arranged along the second direction DR2. For example, the second pixel column COL2 may be disposed between two first pixel columns COL1. The first pixel column COL1 may be disposed between two second pixel columns COL2.

The first sub-pixel SPX1 and the second sub-pixel SPX2, which are adjacent to each other along the first direction DR1, may form a pixel PXL (or a pixel unit) with the third sub-pixel SPX3 adjacent to the first sub-pixel SPX1 and the second sub-pixel SPX2 along the second direction DR2.

In some embodiments, in the display device DD, at least some of sensing electrodes SP (e.g., cells C) may be formed by the second conductive pattern layer CP2. In some embodiments, at least a portion of the second conductive pattern layer CP2 may surround at least one of the sub-pixel areas SPXA. Accordingly, the second conductive pattern layer CP2 may form a mesh structure.

In some embodiments, a first sensing electrode SP1 and a second sensing electrode SP2 may be disposed while being adjacent to the sub-pixel areas SPXA. For example, the first sensing electrode SP1 and the second sensing electrode SP2 may be spaced apart from each other with respect to a separation line SEL. For example, a first cell C1 and a second cell C2 may be spaced apart from each other with the separation line SEL interposed therebetween.

In some embodiments, as at least a portion of the second conductive pattern layer CP2 may be cut (e.g., disconnected), and a separation disconnection area SOPA for defining (e.g., forming) the separation line SEL may be formed. Since second conductive pattern layers CP2 are electrically separated from each other with the separation line SEL interposed therebetween, the first sensing electrode SP1 and the second sensing electrode SP2 may be defined, to which different sensing signals can be supplied.

A position of the separation disconnection area SOPA is not limited to the position shown in FIG. 13.

The position at which the separation disconnection area SOPA is formed may correspond to a position at which portions of the second conductive pattern layer CP2 intersect each other (e.g., an intersection portion CA) (see FIG. 19) so as to form the mesh structure. This will be described below in conjunction with a position of a disconnection area OPA with reference to FIG. 19.

The second conductive pattern layer CP2 may be disposed at the periphery of the sub-pixel SPX (or the sub-pixel areas SPXA). The second conductive pattern layer CP2 may surround at least a portion of the sub-pixel area SPXA. As the second conductive pattern layer CP2 is disposed at a peripheral portion of the sub-pixel SPX, reduction of light emission efficiency can be prevented, and a decrease of external visibility can be minimized or reduced.

As described above, as the separation disconnection area SOPA is formed, the separation line SEL provided to form the sensing electrodes SP1 and SP2 can be provided. In addition, the disconnection area OPA forming a pattern structure with the separation disconnection area SOPA is provided, and as a result, a decrease of the external visibility can be further prevented or reduced.

In accordance with an embodiment, the position at which the disconnection area OPA is formed may be defined with respect to each pixel PXL. As a pixel PXL is repeatedly disposed with respect to disconnection areas OPA defined in the pixel PXL, the disconnection areas OPA may be formed in the sensing area SA with respect to a pattern.

For example, the first sub-pixel SPX1, the second sub-pixel SPX2, and the third sub-pixel SPX3 may form a pixel PXL, and the disconnection area OPA may be disposed at each of a side and another side of the defined pixel PXL. In an embodiment, the disconnection area OPA is not formed in an area inside the defined pixel PXL.

In some embodiments, the disconnection area OPA may be disposed on a first virtual line VL1 between the first sub-pixel area SPXA1 and the third sub-pixel area SPXA3. The first virtual line VL1 may be a line on which a portion of the second conductive pattern layer CP2 disposed adjacent to an upper side of the first sub-pixel area SPXA1 and the third sub-pixel area SPXA3 extends. The first virtual line VL1 may extend in the second direction DR2. Accordingly, the disconnection area OPA may be disposed at a side of the pixel PXL, and be disposed between the first sub-pixel area SPXA1 and the third sub-pixel area SPXA3 with respect to the second direction DR2.

In some embodiments, the disconnection area OPA may be disposed on a second virtual line VL2 between the second sub-pixel area SPXA2 and the third sub-pixel area SPXA3. The second virtual line VL2 may be a line on which a portion of the second conductive pattern layer CP2 disposed adjacent to a lower side of the second sub-pixel area SPXA2 and the third sub-pixel area SPXA3 extends. The second virtual line VL2 may extend in the second direction DR2. Accordingly, the disconnection area OPA may be disposed at a side of the pixel PXL, and be disposed between the second sub-pixel area SPXA2 and the third sub-pixel area SPXA3 with respect to the second direction DR2.

In some embodiments, the disconnection area OPA is not disposed on a middle virtual line VL_N. The middle virtual line VL_N may penetrate an internal area of the pixel PXL. The middle virtual line VL_N may penetrate at least one of the sub-pixel areas SPXA1, SPXA2, and SPXA3. For example, the middle virtual line VL_N may penetrate the third sub-pixel area SPXA3. In some embodiment, the middle virtual line VL_N may be a line on which a portion (e.g., a middle extension layer ML) of the second conductive pattern layer CP2 formed between the first sub-pixel area SPXA1 and the second sub-pixel area SPXA2 extends.

Each of the first virtual line VL1 and the second virtual line VL2 may be formed at an edge portion of the pixel PXL. The first virtual line VL1 and the second virtual line VL2 may be parallel to each other. In some embodiments, the first virtual line VL1 and the second virtual line VL2 may be parallel to the middle virtual line VL_N. The middle virtual line VL_N may be disposed between the first virtual line VL1 and the second virtual line VL2.

Disconnection areas OPA respectively formed at positions with respect to the virtual lines VL1 and VL2 may be arranged in a matrix structure as the pixel PXL is repeatedly disposed. For example, the disconnection areas OPA may be disposed between the first pixel column COL1 and the second pixel column COL2. The disconnection areas OPA may be disposed between different pixels PXL adjacent to each other in the first direction DR1.

In accordance with an embodiment, a first cover layer COV1 may cover the disconnection area OPA, and a second cover layer COV2 may be disposed in an area in which the disconnection area OPA is not formed according to a predetermined reference. Accordingly, the second cover layer COV may overlap the first cover layer COV1 in the first direction DR1 and the second direction DR2.

For example, the first cover layer COV1 may be disposed on the first virtual line VL1 and the second virtual line VL2. The second cover layer COV2 may be disposed on the first virtual line VL1 and the second virtual line VL2. In an embodiment, the first cover layer COV1 and the second cover layer COV2 are not disposed on the middle virtual line VL_N. Accordingly, the first cover layer COV1 and the second cover layer COV2 may form a matrix structure.

In accordance with an embodiment, the cover layer COV may have various shapes in a plan view. For example, in some embodiments, the cover layer COV may have a circular shape (or an elliptical shape) in a plan view (see FIG. 15). For example, in some embodiments, the cover layer COV may have a polygonal shape (e.g., a quadrangular shape) in a plan view (see FIG. 16). However, the disclosure is not limited thereto.

In accordance with an embodiment, the disconnection areas OPA may be defined at an intersection portion CA at which the second conductive pattern layers CP2 intersect each other so as to form the mesh structure. Accordingly, the first cover layer COV1 may be defined at the intersection portion CA at which the second conductive pattern layers CP2 intersect each other.

For example, the second conductive pattern layer CP2 forming the sensing electrode SP (e.g., the cell C) may include a first extension portion EXP1 extending in a first extending direction (e.g., the first direction DR1) and a second extension portion EXP2 extending in a second extending direction (e.g., the second direction DR2) different from the first extending direction. The first extension portion EXP1 and the second extension portion EXP2 may intersect each other at the intersection portion CA. The intersection portion CA may be a node portion at which the first extension portion EXP1 and the second extension portion EXP2 overlap each other in a plan view.

In some embodiments, in the sensing area SA (e.g., in an area in which the cell C is formed), other portions of the second conductive pattern layer CP2 may extend in four or more directions from the intersection portion CA.

For example, the first extension portion EXP1 may include a (1-1)th extension portion EXP1-1 extending in a (1-1)th extending direction from the intersection portion CA and a (1-2)th extension portion EXP1-2 extending in a (1-2)th extending direction from the intersection portion CA. The second extension portion EXP2 may include a (2-1)th extension portion EXP2-1 extending in a (2-1)th extending direction from the intersection portion CA and a (2-2)th extension portion EXP2-2 in a (2-2)th extending direction from the intersection portion CA.

However, the disclosure is not limited thereto, and the directions in which the portions of the second conductive pattern layer CP2 extend may be defined with respect to five or more directions instead of the four directions.

The (1-1)th extending direction may be an upper direction with respect to the intersection portion CA. The (1-2)th extending direction may be a lower direction with respect to the intersection portion CA. The (2-1)th extending direction may be a right direction with respect to the intersection portion CA. The (2-2)th extending direction may be a left direction with respect to the intersection portion CA.

In some embodiments, the (1-1)th extending direction and the (1-2)th extending direction may be parallel to the first direction DR1. The (2-1)th extending direction and the (2-2)th extending direction may be parallel to the second direction DR2. However, the disclosure is not limited thereto.

In some embodiments, the disconnection area OPA may be formed in an area of one or more of the extension portions EXP1-1, EXP1-2, EXP2-1, and EXP2-2. For convenience of description, FIG. 19 illustrates an embodiment in which the disconnection area OPA is formed at the (2-2)th extension portion EXP2-2. However, the disclosure is not limited thereto, and the disconnection area OPA may be formed at one or more portions among the extension portions EXP1-1, EXP1-2, EXP2-1, and EXP2-2.

In some embodiments, the cover layer COV may be disposed to overlap the intersection portion CA. The cover layer COV may be patterned such that a central portion of the cover layer roughly corresponds to a central portion of the intersection portion CA. The cover layer COV (e.g., the first cover layer COV1) may cover at least a portion of each of the extension portions EXP1-1, EXP1-2, EXP2-1, and EXP2-2, and entirely cover the disconnection area OPA.

In accordance with an embodiment, the cover layer COV may be patterned to overlap the intersection portion CA and to overlap portions of the second conductive patterns CP2, which extend in four or more directions, and accordingly, a risk that visibility will be decreased as the disconnection area OPA is formed can be prevented or reduced. For example, a range in which the cover layer COV covers an area in which the second conductive pattern layer CP2 is not disposed can be minimized or reduced, and accordingly, a degree to which an area in which light is emitted is covered can be minimized or reduced.

In accordance with an embodiment, the second conductive pattern layer CP2 may include a protrusion portion PRU protruding at least a portion of the extension portions EXP1-1, EXP1-2, EXP2-1, and EXP2-2. For convenience of description, an embodiment in which the protrusion portion PRU protrudes from a body portion BOD as the (1-1)th extension portion EXP1-1 forms the body portion BOD will be mainly described.

The protrusion portion PRU may protrude in a direction in which the first virtual line VL1 and the second virtual line VL2 extend. For example, the protrusion portion PRU may be integrally formed with the body portion BOD, and extend in the second direction DR2.

The protrusion portion PRU may be adjacent to the third sub-pixel area SPXA3. The protrusion portion PRU may be disposed between the third sub-pixel area SPXA3 and a portion (e.g., the (2-1)th extension portion EXP2-1) of another second conductive pattern layer CP2. A separation area SPA may be formed between the third sub-pixel area SPXA3 and the portion (e.g., the (2-1)th extension portion EXP2-1) of the another second conductive pattern layer CP2. In some embodiments, the separation area SPA may be directly adjacent to the cover layer COV. At least a portion of the cover layer COV may be disposed in the separation area SPA. The protrusion portion PRU may overlap the third sub-pixel area SPXA3 along the first direction DR1. In some embodiments, the protrusion portion PRU may overlap the second sub-pixel area SPXA2 along the second direction DR2.

In accordance with an embodiment, as the protrusion portion PRU is formed, widths of the extension portions EXP1-1, EXP1-2, EXP2-1, and EXP2-2 extending in four or more directions with respect to the intersection portion CA may be roughly uniformly provided. A portion of the second conductive pattern layer CP2 formed at an upper side of the pixel PXL and a portion of the second conductive pattern layer CP2 formed at a lower side of the pixel PXL may have widths corresponding to each other and extend in the same direction. Accordingly, the visibility can be further improved.

In accordance with an embodiment, as the protrusion portion PRU is formed, separation distances between the sub-pixel areas SPXA and the second conductive pattern layer CP2 may be roughly uniformly defined. The second conductive pattern layer CP2 in accordance with an embodiment of the disclosure may be spaced apart from each of the sub-pixel areas SPXA at a roughly uniform distance.

For example, the first sub-pixel area SPXA1 may be spaced apart from the second conductive pattern layer CP2 at a first distance D1 in a plan view. The second sub-pixel area SPXA2 may be spaced apart from the second conductive pattern layer CP2 at a second distance D2 in a plan view. The third sub-pixel area SPXA3 may be spaced apart from the second conductive pattern layer CP2 at a third distance D3 in a plan view. Each of the first distance D1, the second distance D2, and the third distance D3 may be defined with respect to a portion of the second conductive pattern layer CP2 closest to each of the sub-pixel areas SPXA. In some embodiments, the first distance D1, the second distance D2, and the third distance D3 may be substantially the same, and accordingly, the visibility can be further improved.

A display device DD in accordance with an embodiment of the disclosure will be described with reference to FIGS. 20 to 22. For convenience of explanation, a further description of components and technical aspects previously described may be omitted.

Figure 20:
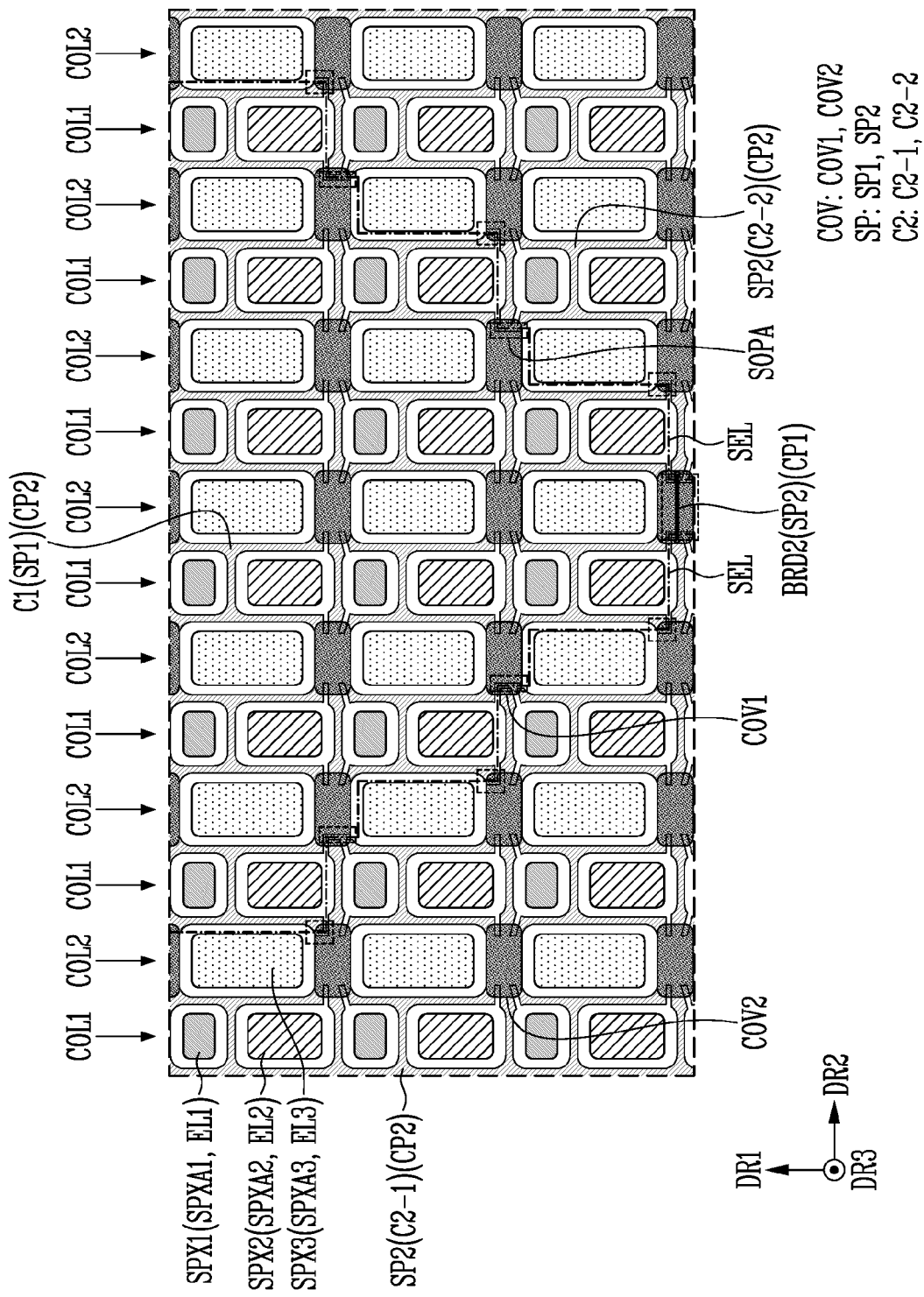
FIGS. 20 to 22 are schematic views illustrating a display device in accordance with an embodiment of the disclosure.
Figure 21:
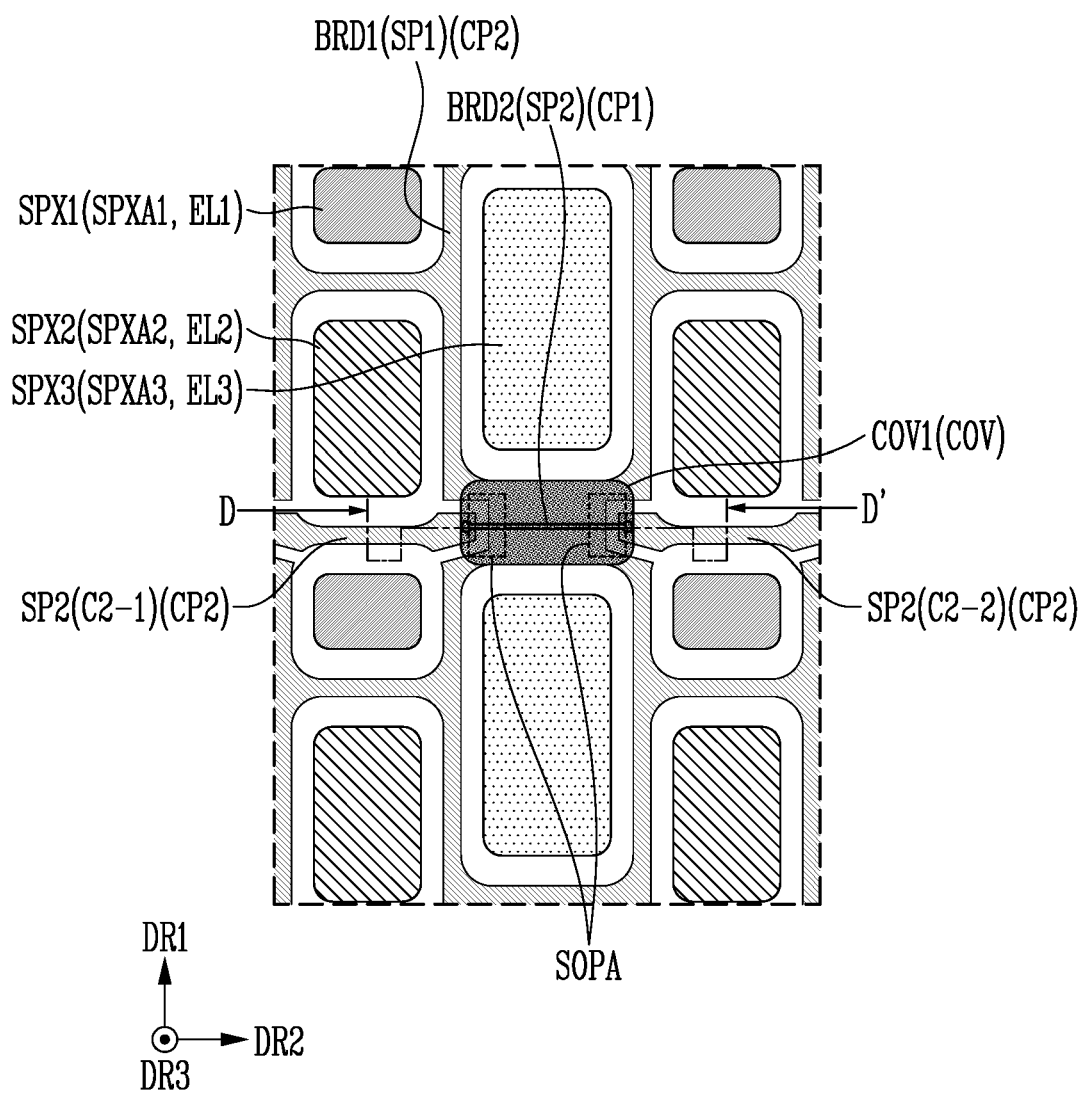
Figure 22:
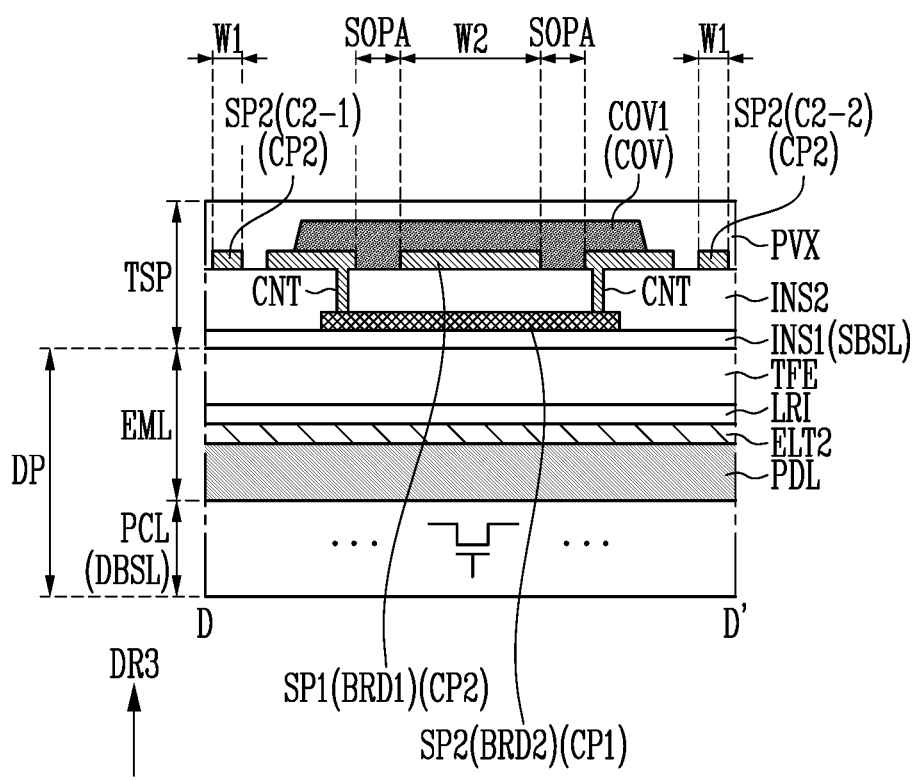

FIGS. 20 to 22 are schematic views illustrating a display device in accordance with an embodiment of the disclosure.

FIGS. 20 and 21 are schematic plan views illustrating a display device DD in accordance with an embodiment of the disclosure. FIG. 22 is a schematic cross-sectional view illustrating the display device DD in accordance with the embodiment of the disclosure.

FIGS. 20 and 21 may be schematic plan views illustrating sub-pixel areas SPXA and a second conductive pattern layer CP2. FIG. 22 is a schematic cut-away cross-sectional view taken along line D-D' shown in FIG. 21.

Referring to FIGS. 20 to 22, the display device DD in accordance with an embodiment is different from the display device DD in accordance with an embodiment described above, in that a second conductive pattern layer CP2 has a relatively wide width between third sub-pixel areas SPXA3 adjacent to each other along the first direction DR1, and a second bridge BRD2 is disposed under the second conductive pattern layer CP2.

In some embodiments, the second bridge BRD2 is a portion of a second sensing electrode SP2, and may be formed by a first conductive pattern layer CP1. The second bridge BRD2 may be electrically connected to a (2-1)th cell C2-1 through a contact portion CNT. The second bridge BRD2 may be electrically connected to a (2-2)th cell C2-2 through a contact portion CNT.

In some embodiments, the second bridge BRD2 may overlap a separation disconnection area SOPA in a plan view. The second bridge BRD2 may overlap a cover layer COV in a plan view.

In some embodiments, a first bridge BRD1 is a portion of a first sensing electrode SP1, and may be formed by a second conductive pattern layer CP2. At least a portion of the first bridge BRD1 may be disposed between second sub-pixel areas SPXA2.

A portion of a second cell C2 electrically connected to the second bridge BRD2 may extend in the second direction DR2, and have a first width W1 between a first sub-pixel area SPXA1 and a second sub-pixel area SPXA2 with respect to the first direction DR1. The first bridge BRD1 may extend in the first direction DR1, and have a second width W2 between second sub-pixel areas SPXA2 with respect to the second direction DR2. In some embodiments, the second width W2 may be wider than the first width W1.

In accordance with an embodiment, as the second conductive pattern layer CP2 has a wide width between some sub-pixel areas SPXA, the second bridge BRD2 is thoroughly covered. As the second conductive pattern layer CP2 having a wide width is directly covered by the cover layer COV, a risk that visibility will be decreased can be reduced.

Similar to an embodiment described above, positions of cover layers COV are defined with respect to the pixel PXL, and the cover layers COV are patterned according to a reference, so that the visibility can be improved.

A display device DD in accordance with an embodiment of the disclosure will be described with reference to FIG. 23. For convenience of explanation, a further description of components and technical aspects previously described may be omitted.

Figure 23:
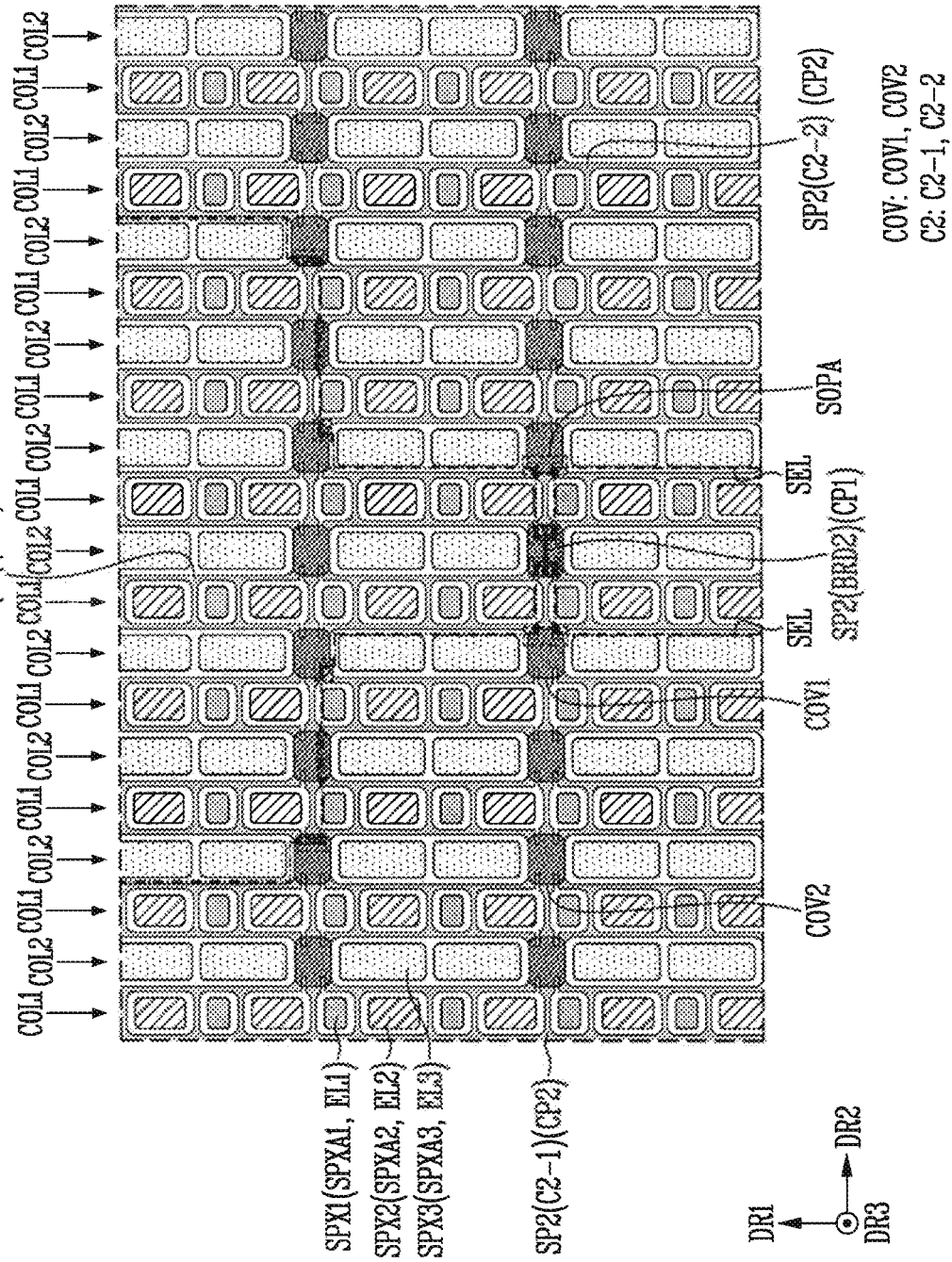
FIG. 23 is a schematic view illustrating a display device in accordance with an embodiment of the disclosure.

FIG. 23 is a schematic view illustrating a display device in accordance with an embodiment of the disclosure.

FIG. 23 is a schematic plan view illustrating a display device DD in accordance with an embodiment of the disclosure. FIG. 23 is a schematic plan view illustrating sub-pixel areas SPXA and a second conductive pattern layer CP2.

Referring to FIG. 23, the display device DD in accordance with an embodiment is different from the display device DD in accordance with an embodiment described above, in that no second conductive pattern layer CP2 is disposed between third sub-pixel areas SPXA3.

For example, a portion of a second conductive pattern layer CP2 having a relatively wide width may be disposed between some third sub-pixel areas SPXA3, and a second bridge BRD2 may be disposed under the second conductive pattern layer CP2. In addition, as the second conductive pattern layer CP2 is not disposed between other third sub-pixel areas SPXA3, the other third sub-pixel areas SPXA3 may be directly adjacent to each other.

Similar to an embodiment described above, positions of cover layers COV are defined with respect to the pixel PXL, and the cover layers COV are patterned according to a reference, so that the visibility can be improved.

In accordance with embodiments of the disclosure, a display device including a touch sensor, which can improve visibility, is provided.

In accordance with embodiments of the disclosure, a display device including a touch sensor, in which the cross-sectional structure of a panel is simplified, so that processing properties can be improved, is provided.

While the present disclosure has been particularly shown and described with reference to embodiments thereof, it will be understood by those of ordinary skill in the art that various changes in form and detail may be made therein without departing from the spirit and scope of the present invention as defined by the following claims.

What is claimed is:

1. A display device, comprising:
a display part formed on a base layer, the display part including a plurality of pixels; and
a sensor part disposed on the display part, the sensor part including a conductive pattern layer and a cover layer disposed on the conductive pattern layer,
wherein the conductive pattern layer includes a first conductive pattern layer and a second conductive pattern layer, which are disposed in different layers,
wherein the conductive pattern layer forms a first sensing electrode and a second sensing electrode, and includes an edge portion forming a disconnection area, and
wherein the cover layer includes a first cover layer overlapping the disconnection area in a plan view, and a second cover layer covering at least a portion of the second conductive pattern layer,
wherein the second cover layer does not overlap the disconnection area in the plan view.

2. The display device of claim 1,
wherein the first sensing electrode includes a plurality of first cells and a first bridge electrically connecting the first cells to each other, and the second sensing electrode includes a plurality of second cells and a second bridge electrically connecting the second cells to each other,
wherein the edge portion includes a first edge portion and a second edge portion, which are formed by the second conductive pattern layer, and the disconnection area is formed between the first edge portion and the second edge portion,
wherein the disconnection area is formed in the first cells and the second cells, and
wherein the first cells and the second cells are formed by the second conductive pattern layer, and have a mesh structure.

3. The display device of claim 2, wherein the first cells and the second cells are adjacent to each other with a separation line interposed therebetween, and at least a portion of the second conductive pattern layer is disconnected and forms a separation disconnection area which defines the separation line, and
wherein the first cover layer covers the separation disconnection area.

4. The display device of claim 3, wherein the second cover layer does not overlap the separation disconnection area in the plan view.

5. The display device of claim 4, wherein each of the first cover layer and the second cover layer is provided in a plurality and is arranged in a matrix structure.

6. The display device of claim 2, wherein the cover layer has a polygonal shape or a circular shape in the plan view, and is in contact with a portion of the second conductive pattern layer.

7. The display device of claim 2, wherein each of the pixels includes a plurality of sub-pixels including:
a first sub-pixel forming a first sub-pixel area in which light of a first color is provided;
a second sub-pixel forming a second sub-pixel area in which light of a second color is provided; and
a third sub-pixel forming a third sub-pixel area in which light of a third color is provided,
wherein the first sub-pixel area and the second sub-pixel area are adjacent to each other in a first direction,
wherein the first sub-pixel area and the second sub-pixel area are adjacent to the third sub-pixel area in a second direction different from the first direction, and wherein the cover layer is provided in a plurality and is arranged in a matrix structure along the first direction and the second direction.

8. The display device of claim 7, wherein a position at which the disconnection area is formed is defined with respect to each of the pixels, and the disconnection area is repeatedly formed according to a predetermined reference as the pixels are repeatedly patterned.

9. The display device of claim 8, wherein the disconnection area is disposed on a first virtual line and a second virtual line, each of which extends in the second direction, and is not disposed on a middle virtual line between the first virtual line and the second virtual line,
wherein the first virtual line is a line on which a portion of the second conductive pattern layer disposed adjacent to the first sub-pixel area and a first side of the third sub-pixel area extends,
wherein the second virtual line is a line on which another portion of the second conductive pattern layer disposed adjacent to the second sub-pixel area and a second side of the third sub-pixel area extends,
wherein the middle virtual line extends in the second direction, penetrates the third sub-pixel area, and is disposed between the first sub-pixel area and the second sub-pixel area,
wherein the first sub-pixel area and the second sub-pixel area form a first pixel column, and the third sub-pixel area forms a second pixel column adjacent to the first pixel column along the second direction, and
wherein the disconnection area is disposed between the first pixel column and the second pixel column.

10. The display device of claim 7, wherein the second conductive pattern layer includes a protrusion portion extending in the second direction, the protrusion portion being adjacent to the third sub-pixel area along the first direction and overlapping the second sub-pixel area along the second direction.

11. The display device of claim 7, wherein the first sub-pixel area is spaced apart from the second conductive pattern layer at a first distance in the plan view,
the second sub-pixel area is spaced apart from the second conductive pattern layer at a second distance in the plan view,
the third sub-pixel area is spaced apart from the second conductive pattern layer at a third distance in the plan view, and
wherein the first distance, the second distance, and the third distance are about equal to one another.

12. The display device of claim 7, wherein the display part includes an anode electrode, a cathode electrode, and a light emitting part electrically connected between the anode electrode and the cathode electrode, and
wherein the light emitting part includes a first light emitting part included in the first sub-pixel that emits light of the first color, a second light emitting part included in the second sub-pixel that emits light of the second color, and a third light emitting part included in the third sub-pixel that emits light of a third color.

13. The display device of claim 7, wherein the third sub-pixel area is one of a plurality of third sub-pixel areas adjacent to each other in the first direction,
wherein a width of a portion of the second conductive pattern layer disposed between the adjacent third sub-pixel areas is wider than a width of another portion of the second conductive pattern layer disposed between the first sub-pixel area and the second sub-pixel area, and wherein, in the plan view, the second bridge is disposed between the adjacent third sub-pixel areas, and is covered by the cover layer.

14. The display device of claim 1, wherein the cover layer includes at least one of a black pigment and a black dye.

15. The display device of claim 1, wherein the conductive pattern layer includes a first extension portion extending in a first extending direction and a second extension portion extending in a second extending direction different from the first extending direction,
wherein the first extension portion and the second extension portion intersect each other at an intersection portion which is a portion of the conductive pattern layer, and
wherein the disconnection area is formed adjacent to the intersection portion.

16. The display device of claim 15, wherein the first extension portion includes a (1-1)th extension portion disposed at a first side of the intersection portion with respect to the first extending direction and a (1-2)th extension portion disposed at a second side of the intersection portion with respect to the first extending direction,
wherein the second extension portion includes a (2-1)th extension portion disposed at a first side of the intersection portion with respect to the second extending direction and a (2-2)th extension portion disposed at a second side of the intersection portion with respect to the second extending direction, and
wherein the disconnection area is formed at one or more of the (1-1)th extension portion, the (1-2)th extension portion, the (2-1)th extension portion, and the (2-2)th extension portion.

17. The display device of claim 16, wherein widths of the (1-1)th extension portion, the (1-2)th extension portion, the (2-1)th extension portion, and the (2-2)th extension portion are about equal to one another.

18. A display device comprising:
a display part formed on a base layer, the display part including a plurality of pixels; and
sensor part disposed on the display part, the sensor part including a conductive pattern layer and a cover layer disposed on the conductive pattern layer,
wherein the conductive pattern layer forms a first sensing electrode and a second sensing electrode, and includes an edge portion forming a disconnection area,
wherein the cover layer includes a first cover layer overlapping the disconnection area in a plan view,
wherein the conductive pattern layer includes a first conductive pattern layer and a second conductive pattern layer, which are disposed in different layers,
wherein the first sensing electrode includes a plurality of first cells and a first bridge electrically connecting the first cells to each other, and the second sensing electrode includes a plurality of second cells and a second bridge electrically connecting the second cells to each other,
wherein the edge portion includes a first edge portion and a second edge portion, which are formed by the second conductive pattern layer, and the disconnection area is formed between the first edge portion and the second edge portion,
wherein the disconnection area is formed in the first cells and the second cells, and
wherein the first cells and the second cells are formed by the second conductive pattern layer, and have a meshi structure, wherein each of the pixels includes a plurality of sub-pixels including:
a first sub-pixel forming a first sub-pixel area in which light of a first color is provided;
a second sub-pixel forming a second sub-pixel area in which light of a second color is provided; and
a third sub-pixel forming a third sub-pixel area in which light of a third color is provided,
wherein the first sub-pixel area and the second sub-pixel area are adjacent to each other in a first direction,
wherein the first sub-pixel area and the second sub-pixel area are adjacent to the third sub-pixel area in a second direction different from the first direction,
wherein the cover layer is provided in a plurality and is arranged in a matrix structure along the first direction and the second direction,
wherein the third sub-pixel area is one of a plurality of third sub-pixel areas adjacent to each other in the second direction, and
wherein the second conductive pattern layer is not disposed between the adjacent third sub-pixel areas.

19. An electronic device, comprising:
a display part formed on a base layer, the display part including a plurality of pixels; and
a sensor part disposed on the display part, the sensor part including a conductive pattern layer forming a sensing electrode and a cover layer disposed on the conductive pattern layer,
wherein each of the pixels includes a plurality of sub-pixels, including:
a first sub-pixel forming a first sub-pixel area in which light of a first color is provided;
a second sub-pixel forming a second sub-pixel area in which light of a second color is provided; and
a third sub-pixel forming a third sub-pixel area in which light of a third color is provided,
wherein the first sub-pixel area and the second sub-pixel area are adjacent to the third sub-pixel area in a first direction,
wherein the first sub-pixel area and the second sub-pixel area are adjacent to each other in a second direction different from the first direction,
wherein the conductive pattern layer includes a first conductive pattern layer and a second conductive pattern layer,
wherein the second conductive pattern layer forms at least a portion of the sensing electrode, and surrounds at least a portion of each of the first sub-pixel area, the second sub-pixel area, and the third sub-pixel area,
wherein at least a portion of the second conductive pattern layer is disconnected and forms a disconnection area,
wherein the cover layer includes a first cover layer disposed on the disconnection area and a second cover layer disposed on a portion of the second conductive pattern layer, and
wherein the first cover layer and the second cover layer are arranged in a matrix structure.

* * * * *